(12) United States Patent
Kataoka et al.

(10) Patent No.: US 9,496,891 B2
(45) Date of Patent: Nov. 15, 2016

(54) COMPRESSION DEVICE, COMPRESSION METHOD, DECOMPRESSION DEVICE, DECOMPRESSION METHOD, AND COMPUTER-READABLE RECORDING MEDIUM

(71) Applicant: FUJITSU LIMITED, Kawasaki-shi, Kanagawa (JP)

(72) Inventors: Masahiro Kataoka, Kamakura (JP); Hideto Higashi, Yokohama (JP); Takaki Ozawa, Numazu (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/804,392

(22) Filed: Jul. 21, 2015

(65) Prior Publication Data

US 2016/0056839 A1 Feb. 25, 2016

(30) Foreign Application Priority Data

Aug. 20, 2014 (JP) ................................. 2014-167895

(51) Int. Cl.
*H03M 7/30* (2006.01)
(52) U.S. Cl.
CPC .................................... *H03M 7/30* (2013.01)
(58) Field of Classification Search
CPC ...................................................... H03M 7/30
USPC ............................... 341/50, 51, 106, 107, 87
See application file for complete search history.

(56) References Cited

U.S. PATENT DOCUMENTS

| | | | | | |
|---|---|---|---|---|---|
| 5,499,293 | A | * | 3/1996 | Behram | G06F 19/323 341/106 |
| 5,590,317 | A | * | 12/1996 | Iguchi | G06F 17/30011 |
| 5,867,114 | A | * | 2/1999 | Barbir | G06T 9/005 341/107 |
| 6,307,488 | B1 | * | 10/2001 | Cooper | G06T 9/005 341/51 |
| 6,834,283 | B1 | * | 12/2004 | Satoh | H03M 7/30 |
| 8,131,721 | B2 | | 3/2012 | Kataoka et al. | |
| 8,704,685 | B2 | | 4/2014 | Kataoka | |
| 2012/0072434 | A1 | | 3/2012 | Kataoka et al. | |

FOREIGN PATENT DOCUMENTS

| | | |
|---|---|---|
| JP | 5-174064 | 7/1993 |
| JP | 2013-150041 | 8/2013 |
| WO | WO 2008/047432 A1 | 4/2008 |

\* cited by examiner

*Primary Examiner* — Jean B Jeanglaude
(74) *Attorney, Agent, or Firm* — Oblon, McClelland, Maier & Neustadt, L.L.P.

(57) ABSTRACT

A non-transitory computer-readable recording medium has stored therein a compression program that causes a computer to execute a process. The process includes: extracting a numeric character string from input data, the numeric character string indicating a numerical value and including therein at least one numeral; and converting the numeric character string to a compressed code utilizing a dictionary that associates numeric character strings and compressed codes.

10 Claims, 24 Drawing Sheets

FIG.10

| OFFSET | COMPRESSION CODE | CODE |
|---|---|---|
| 0x0000 | A000h | c (order) |
| 0x0004 | A001h | c (box) |
| 0x0007 | A002h | c (1000) |
| 0x0010 | A003h | c (him) |
| 0x0013 | A004h | c (pays) |
| 0x0018 | A005h | c (1,200) |
| ⋮ | ⋮ | ⋮ |
| 0x002F | A016h | c (121) |
| ⋮ | ⋮ | ⋮ |
| 0x0035 | A018h | c (able) |
| ⋮ | ⋮ | ⋮ |
| 0x003F | A025h | c (Kataoka) |
| ⋮ | ⋮ | ⋮ |
| 0x0046 | A036h | c (1024) |
| ⋮ | ⋮ | ⋮ |

| BIT FILTER | | | STATIC DICTIONARY | | | |
|---|---|---|---|---|---|---|
| 2 GRAMS | BITMAP | POINTER TO NUMERICAL VALUE / NUMERIC CHARACTER STRING | CHARACTER STRING LENGTH | WORD CODE | REGISTRATION NUMBER | COMPRESSED CODE |
| 00 | 0_1_0_0_0 | 0 | 1 | B00000 | | |
| 01 | 0_0_1_0_0 | 1 | 1 | B00010 | | |
| ... | | 2 | 1 | B00020 | | |
| 11 | 0_1_0_0_0 | ... | ... | ... | | |
| 15 | 0_0_1_0_0 | 115 | 3 | B00730 | 15 | A017 |
| ... | | ... | ... | ... | | |
| | | 121 | 3 | B00790 | 12 | A00E |
| | | ... | ... | ... | | |
| | | 142 | 3 | B008E0 | | |
| | | 1000 | 4 | B03E80 | 8 | A00A |
| | | 1,000 | 4 | B03E81 | | |
| | | 1001 | 4 | B03E90 | | |
| | | 1,001 | 4 | B03E91 | | |
| | | 1002 | 4 | B03EA0 | | |
| | | 1,002 | 4 | B03EA1 | | |
| | | ... | ... | ... | | |
| | | 1200 | 4 | B04B00 | 5 | A005 |
| 99 | | 1,200 | 4 | B04B01 | | |
| | | ... | ... | ... | | |

121a

COMPRESSION DEVICE, COMPRESSION METHOD, DECOMPRESSION DEVICE, DECOMPRESSION METHOD, AND COMPUTER-READABLE RECORDING MEDIUM

CROSS-REFERENCE TO RELATED APPLICATION

This application is based upon and claims the benefit of priority of the prior Japanese Patent Application No. 2014-167895, filed on Aug. 20, 2014, the entire contents of which are incorporated herein by reference.

FIELD

The embodiments discussed herein are related to a compression device, a compression method, a decompression device, a decompression method, and computer-readable recording medium.

BACKGROUND

There is a technology that extracts numerical values from a text file that is targeted for compression and that compresses the extracted numerical values in units of numerals. In this technology, a compressed code is allocated to each of the numerals from 0 to 9 and then each of the numerals included in the numerical values extracted from the text file that is targeted for the compression is converted into a compressed code. Furthermore, by adding, to the converted compressed code, for example, a code indicating information related to a numerical value, such as specifying of a full width or a half width, the presence or absence of a comma, the presence or absence of a decimal point, the number of significant numerals, or the like, the numerical value is converted into a compressed code.

Patent Document 1: International Publication Pamphlet No. WO 2008/047432

Patent Document 2: Japanese Laid-open Patent Publication No. 2013-150041

Patent Document 3: Japanese Laid-open Patent Publication No. 05-174064

However, if numerical values are compressed in units of numerals, compressed codes associated with the numerals are needed by the same number of digits of the numerals; therefore, the length of compressed codes of the overall numerical values is increased. Consequently, in some cases, the compression ratio may be decreased.

SUMMARY

According to an aspect of the embodiments, a non-transitory computer-readable recording medium has stored therein a compression program that causes a computer to execute a process including: extracting a numeric character string from input data, the numeric character string indicating a numerical value and including therein at least one numeral; and converting the numeric character string to a compressed code utilizing a dictionary that associates numeric character strings and compressed codes.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 10 is a schematic diagram illustrating an example of a dynamic dictionary;

FIG. 11 is a schematic diagram illustrating a second example of the numeric unit in the bit filter;

DESCRIPTION OF EMBODIMENTS

Preferred embodiments will be explained with reference to accompanying drawings. The embodiments can be appropriately used in combination as long as the processes do not conflict with each other.

[a] First Embodiment

Compression Process According to a First Embodiment

Figure 1:
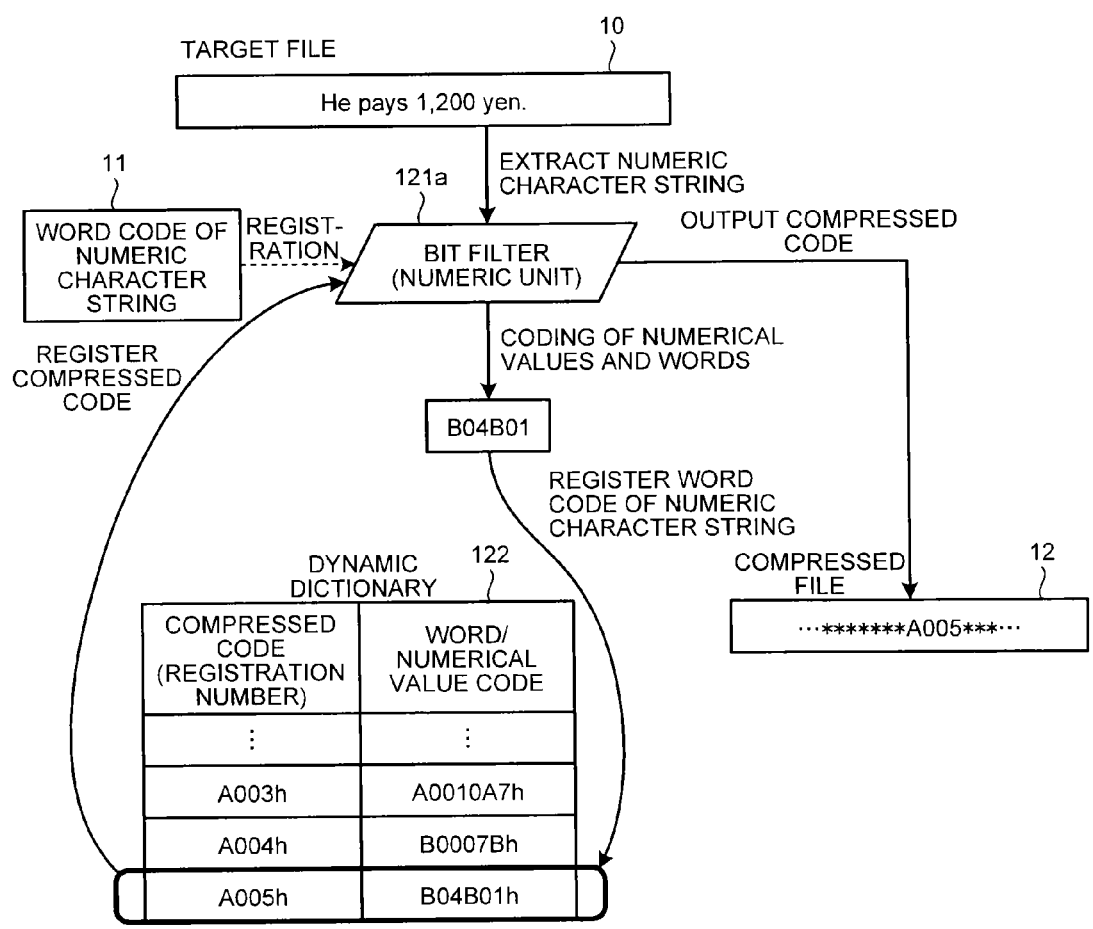
FIG. 1 is a schematic diagram illustrating a compression process of numerical values according to a first embodiment.

A compression process performed by an information processing apparatus 100 according to a first embodiment will be described with reference to FIG. 1. FIG. 1 is a schematic diagram illustrating a compression process of numerical values according to a first embodiment. As in the example illustrated in FIG. 1, the information processing apparatus 100 divides "He pays 1,200 yen . . . " that is included in a target file 10 that is targeted for the compression process into numerical values or words, such as "He", "pays", "1,200", and "yen", and then acquires each of the numerical values or the words. Hereinafter, the numerical value that has one or more numerals is referred to as a numeric character string. The numeric character string may also include, other than numerals, symbols, such as a plus/minus, a comma, a decimal point, or the like. The information processing apparatus 100 extracts the numeric character string "1,200" from among the acquired words and then outputs the extracted string to a numeric unit 121a in a bit filter. The numeric unit 121a in the bit filter is a dictionary that associates a word code with a compressed code for each numeric character string. In the numeric unit 121a in the bit filter, a word code 11 associated with each numeric character string is previously registered. For example, in the numeric unit 121a in the bit filter, the word codes "B00000h", "B00010h", "B00020h", "B00030h", and "B00040h" . . . associated with the integers "0", "1", "2", "3", and "4" . . . , respectively, are previously registered. The data structure of the numeric unit 121a in the bit filter will be described in detail later.

Furthermore, the words, such as "He", "pays", "yen", and the like other than the numeric character strings are output to a word unit 121b in the bit filter, as will be described later. Furthermore, hereinafter, the numeric unit 121a in the bit filter may sometimes be referred to as the bit filter 121a and, furthermore, the word unit 121b in the bit filter may sometimes be referred to as a bit filter 121b. The bit filter 121a and the bit filter 121b will be described in detail later.

Then, the information processing apparatus 100 acquires, from the bit filter 121a, the word code "B04B01h" that is associated with the numeric character string "1,200. Then, the information processing apparatus 100 associates the acquired word code "B04B01h" with the compressed code "A005h" that is dynamically added in the order of the registration in a dynamic dictionary 122 and then registers the association result in the dynamic dictionary 122. Furthermore, the symbol "h" indicated at the end of each of the compressed code word codes "B04B01h" and "A005h" is the sign indicating that the code is represented by hexadecimal numbers.

Then, the information processing apparatus 100 associates the compressed code "A005h" that is dynamically attached in the dynamic dictionary 122 with the numeric character string "1,200" and the word code "B04B01h" and registers the association result in the bit filter 121a. Then, the information processing apparatus 100 acquires, based on the bit filter 121a, the compressed code "A005h" that is associated with the numeric character string "1,200" and outputs the acquired compressed code to a compressed file 12.

Furthermore, if the numeric character string "1,200" appears in the target file 10 next time, the information processing apparatus 100 acquires the compressed code "A005h" that has already been registered in the bit filter 121a and then outputs the compressed code to the compressed file 12.

Figure 2:
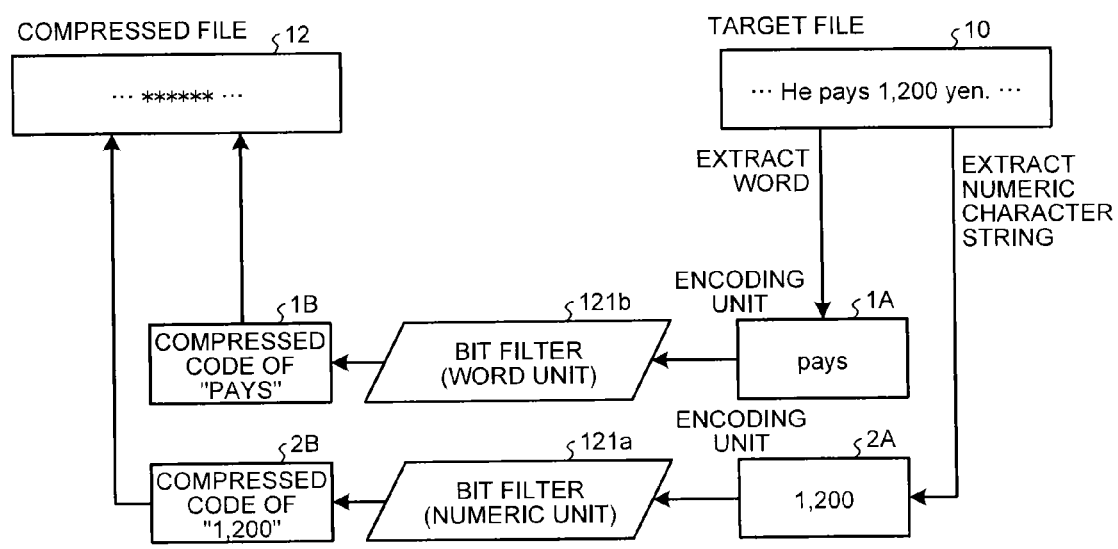
FIG. 2 is a schematic diagram illustrating the overall flow of the compression process according to the first embodiment.

The flow of the overall compression process according to the first embodiment will be described with reference to FIG. 2. FIG. 2 is a schematic diagram illustrating the overall flow of the compression process according to the first embodiment. As in the example illustrated in FIG. 2, the information processing apparatus 100 extracts words or numeric character strings from the target file 10. For example, if the information processing apparatus 100 extracts the word "pays" from the target file 10, the information processing apparatus 100 stores the word "pays" in an encoding unit 1A. The information processing apparatus 100 acquires the compressed code of "pays" from the bit filter (word unit) 121b and stores the compressed code in a storage area 1B.

In contrast, if the information processing apparatus 100 extracts the numeric character string "1,200" from the target file, the information processing apparatus 100 stores the numeric character string "1,200" in an encoding unit 2A. The information processing apparatus 100 acquires the compressed code of the numeric character string "1,200" from the bit filter (numeric unit) 121a and stores the compressed code in a storage area 2B. The information processing apparatus 100 outputs the compressed code stored in the storage area 1B and the storage area 2B to the compressed file 12.

As described above, if the information processing apparatus 100 extracts a word from the target file 10, the information processing apparatus 100 converts the word into a compressed code by using the bit filter 121b, whereas, if the information processing apparatus 100 extracts a numeric character string, the information processing apparatus 100 converts the numeric character string into a compressed code by using the bit filter 121a.

Comparison Between the Reference Example 1 and the First Embodiment

As described above, in the first embodiment, the entirety of the numeric character string is compressed as a single unit. In contrast, in reference example 1, it is assumed that the numerals included in a numeric character string are compressed as a single unit. As in reference example 1, if a numeric character string is compressed in units of numerals, additional information, such as a header, the presence or absence of a comma, the presence or absence of a decimal point, or the like, is added to a compressed code. Furthermore, in reference example 1, if the size of a numeric character string is increased, the code length of the compressed code is increased in proportion to the number of digits of the numeric character string. In contrast, as in the first embodiment, if compression is performed in units of numeric character strings, a compressed code with a fixed length is added regardless of the number of digits of the numerical value. Consequently, when compared with reference example 1, the code length of the compressed code can be decreased.

Furthermore, in the first embodiment, the information processing apparatus 100 may also add different compressed codes to numeric character strings with the same size depending on the presence or absence of a comma, the presence or absence of a decimal point, or the like. For example, the information processing apparatus 100 may also add different compressed codes between "1200" to which no comma is added and "1,200" to which a comma is added.

Figure 3A:
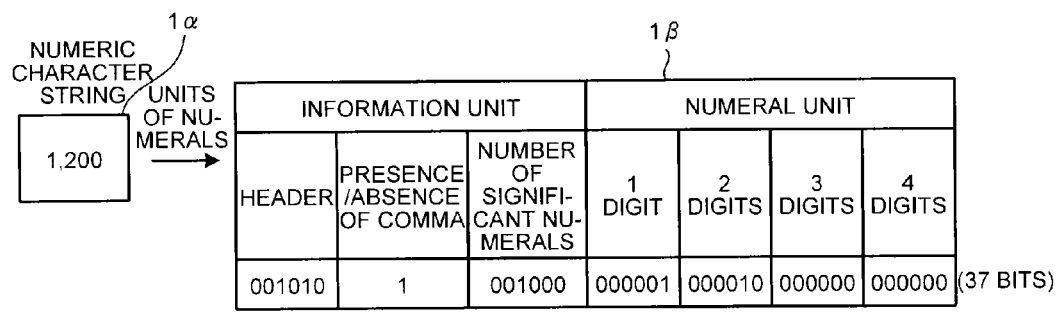
FIG. 3A is a schematic diagram illustrating a code length of reference example 1.

Comparison of code lengths allocated in reference example 1 and the first embodiment will be described with reference to FIGS. 3A, 3B, and 4. FIG. 3A is a schematic diagram illustrating a code length of reference example 1. As in the example illustrated in FIG. 3A, if a numeric character string 1α "1,200" is compressed in units of numerals as in reference example 1, a compressed code 1β includes an information unit and a numeral unit. The information unit includes 6-bit header information, 1-bit comma presence/absence information, and 6-bit number of significant numerals information. In contrast, for the numeral unit, a compressed code is allocated to each digit of the numeric character string and the number of digits of 6 bits×numeric character string corresponds to the number of bits. For example, if a numeric character string is four digits, the number of bits in the numeral unit is 24 bits. Consequently, if the numeric character string is four digits, the code length of the compressed code 1β is 37 bits when information unit and the numeric unit are combined.

Figure 3B:
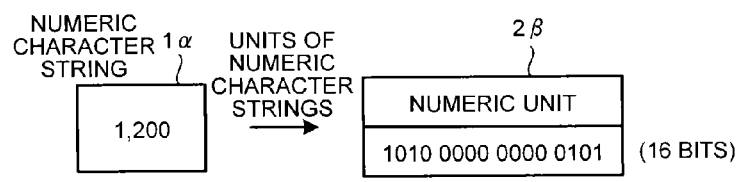
FIG. 3B is a schematic diagram illustrating a code length according to the first embodiment.

FIG. 3B is a schematic diagram illustrating a code length according to the first embodiment. The information processing apparatus 100 according to the first embodiment extracts a numeric character string from, for example, a target file and allocates a 16-bit compressed code to the extracted numeric character string. Namely, the information processing apparatus 100 allocates, to the numeric character string extracted from the target file, 16-bit compressed code "A000h", "A001h", "A002h", and "A003h" . . . in the order they are extracted.

In the first embodiment, for the numeric character string extracted from the target file, the code length of the compressed code is the fixed length with 16 bits. Consequently, the information processing apparatus 100 according to the first embodiment can stably allocate a compressed code with a code length that is smaller than that used in reference example 1.

For example, as in the example illustrated in FIG. 3B, if the numeric character string 1α "1,200" is compressed in units of numerical values as described in the first embodiment, the information processing apparatus 100 adds, to the numeric character string 1α "1,200", the compressed code "1010000000000101" (A005h) with the fixed length of 16 bits as a compressed code 2β.

Figure 4:
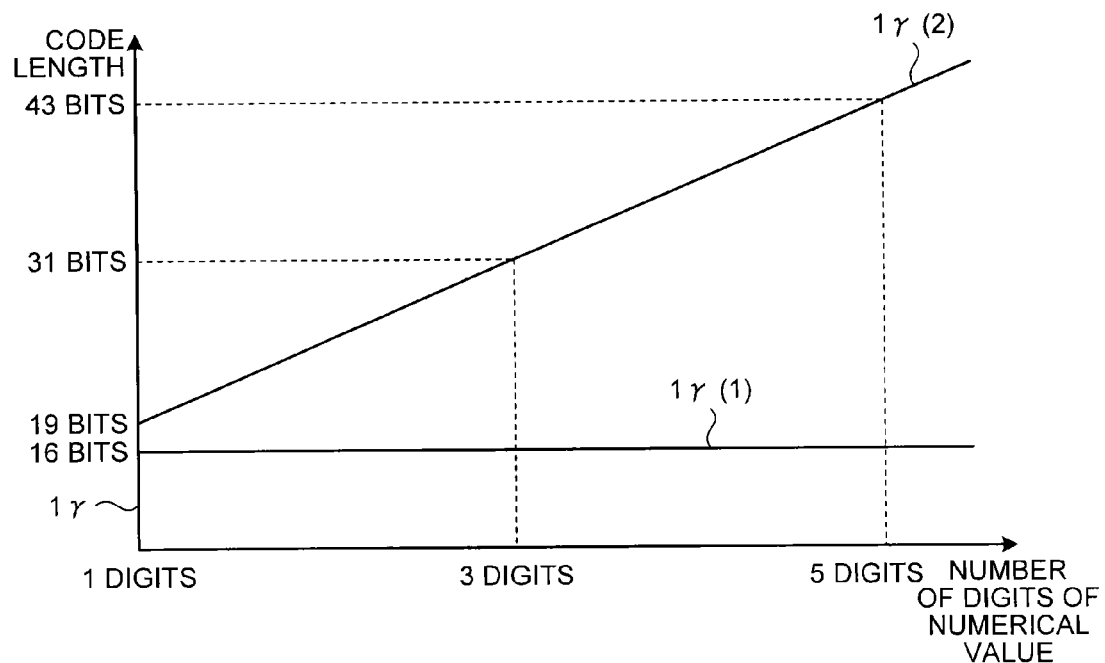
FIG. 4 is a schematic diagram illustrating comparison of code lengths between reference example 1 and the first embodiment.

FIG. 4 is a schematic diagram illustrating comparison of code lengths between the reference example 1 and the first embodiment. Table 1γ is a diagram illustrating the code length associated with the number of digits of a numeric character string. For example, if the numeric character string to be compressed is a single digit, if the compression is performed in units of numeric character strings as in the first embodiment, the code length is 16 bits, whereas, if compression is performed in units of numerals as in reference example 1, the information unit is 13 bits and the numeral unit is 6 bits and thus the total code length is 19 bits. For example, if the numeric character string to be compressed is three digits, as in the first embodiment, if compression is performed in units of numeric character strings, the code length is 16 bits, whereas, as in reference example 1, if compression is performed in units of numerals, the information unit is 13 bits and the numeral unit is 18 bits and thus the total code length is 31 bits. Furthermore, if the numeric character string is five digits, if compression is performed in units of numeric character strings, the code length is 16 bits, whereas, if compression is performed in units of numeral character strings, the code length is 43 bits. Furthermore, in reference example 1, it is assumed that the code length allocated to a numeral with a single digit is 6 bits.

As described above, as in reference example 1, if compression is performed in units of numerals, the code length of a compressed code is increased because the information unit includes therein header information or the like. Furthermore, if the number of digits of a numeric character string is increased, a compressed code with a predetermined length is allocated to each of the digits; therefore, the total code length of the compressed code is increased. In contrast, as in the first embodiment, compression is performed in units of numeric character strings, for example, because compressed codes with the fixed length of 16 bits are sequentially allocated in the order the numerals of the numerical value appear in the target file, the code length allocated to a numeric character string can be stably set to short regardless of the number of digits of a numerical value.

Figure 5:
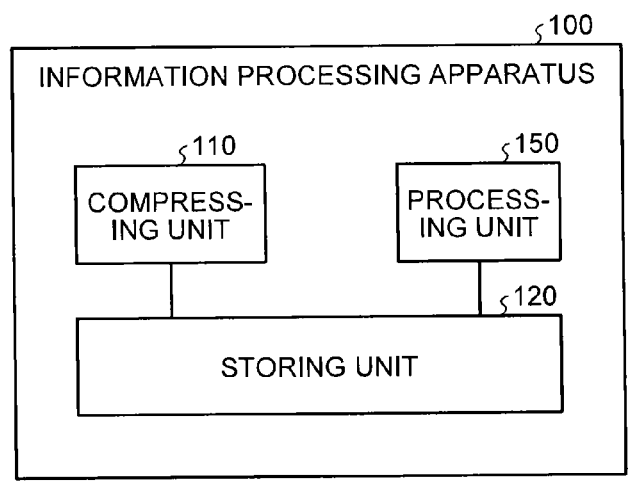
FIG. 5 is a schematic diagram illustrating an example of the system configuration of an information processing apparatus.

Configuration of a Processing Unit Related to a Compression Process According to the First Embodiment The relationship between a compressing unit and a storing unit in the information processing apparatus 100 will be described with reference to FIG. 5. FIG. 5 is a schematic diagram illustrating an example of the system configuration of an information processing apparatus. As in the example illustrated in FIG. 5, a storing unit 120 in the information processing apparatus 100 is connected to a compressing unit 110 and a processing unit 150. The storing unit 120 is, for example, a semiconductor memory device, such as a random access memory (RAM), a read only memory (ROM), a flash memory, and the like, or a storage device, such as such as a hard disk, an optical disk, or the like.

Furthermore, the information processing apparatus 100 includes the compressing unit 110 and the processing unit 150. The functions performed by the compressing unit 110 and the processing unit 150 can be implemented by, for example, a central processing unit (CPU) executing a predetermined program. Furthermore, the functions performed by the compressing unit 110 and the processing unit 150 can be implemented by an integrated circuit, such as an application specific integrated circuit (ASIC), a field programmable gate array (FPGA), or the like.

The compressing unit 110 extracts, from input data, a numeric character string that indicates a numerical value and that includes therein at least a single numeral. The compressing unit 110 refers to a dictionary that stores therein, in an associated manner, numeric character strings and compressed codes and then converts into a compressed code that is associated with the extracted numeric character string.

The dictionary includes therein a first dictionary in which a plurality of predetermined numeric character strings is previously stored and a second dictionary in which the numeric character strings registered in the first dictionary are stored. If the extracted numeric character string is registered in the first dictionary and a compressed code associated with the numeric character string is not registered in the first dictionary, the compressing unit 110 adds a compressed code to the numeric character string, associates the compressed code with the numeric character string that is registered in the first dictionary, and then registers the compressed code. The first dictionary is, for example, a bit filter, whereas the second dictionary is, for example, a dynamic dictionary.

The first dictionary is a dictionary in which, in addition to numeric character strings that can be extracted, codes that are sequentially allocated in accordance with the order of the magnitude of numerical values are further associated and stored.

Figure 6:
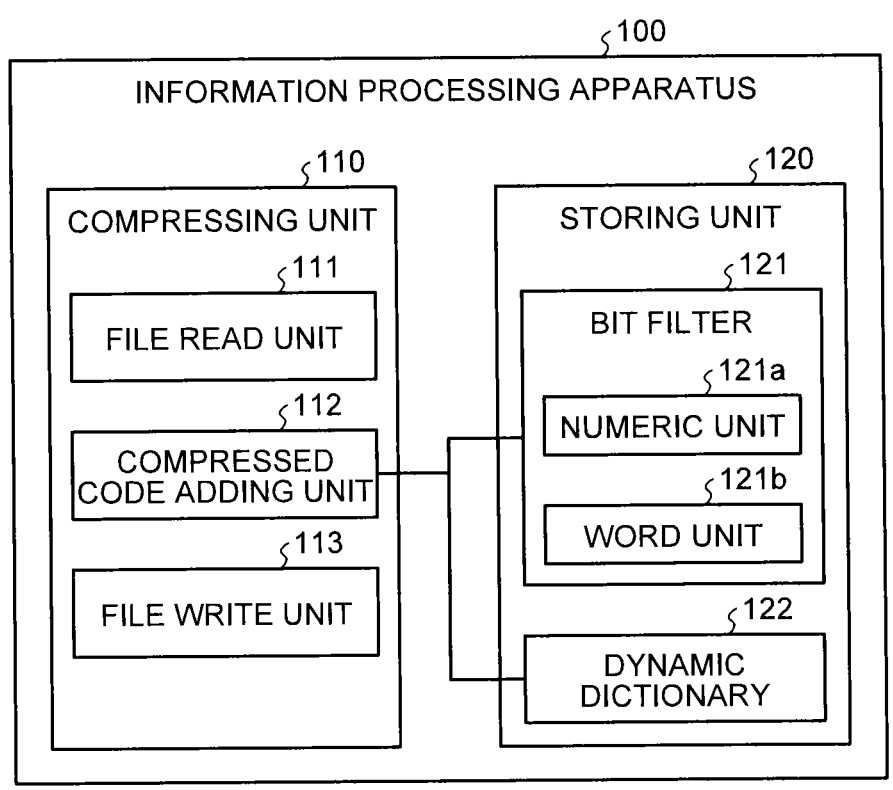
FIG. 6 is a schematic diagram illustrating an example of the system configuration related to the compression process according to the first embodiment.

The system configuration related to the compression process according to the first embodiment will be described with reference to FIG. 6. FIG. 6 is a schematic diagram illustrating an example of the system configuration related to the compression process according to the first embodiment. As indicated in the example illustrated in FIG. 6, the information processing apparatus 100 includes the compressing unit 110 and the storing unit 120. The compressing unit 110 includes a file read unit 111, a compressed code adding unit 112, and a file write unit 113. The storing unit 120 includes a bit filter 121 and the dynamic dictionary 122. The bit filter 121 includes the numeric unit 121a and a word unit 121b. In the following, the configuration of the compressing unit 110 and the storing unit 120 according to the first embodiment will be described.

Configuration of the Storing Unit

Figure 7:
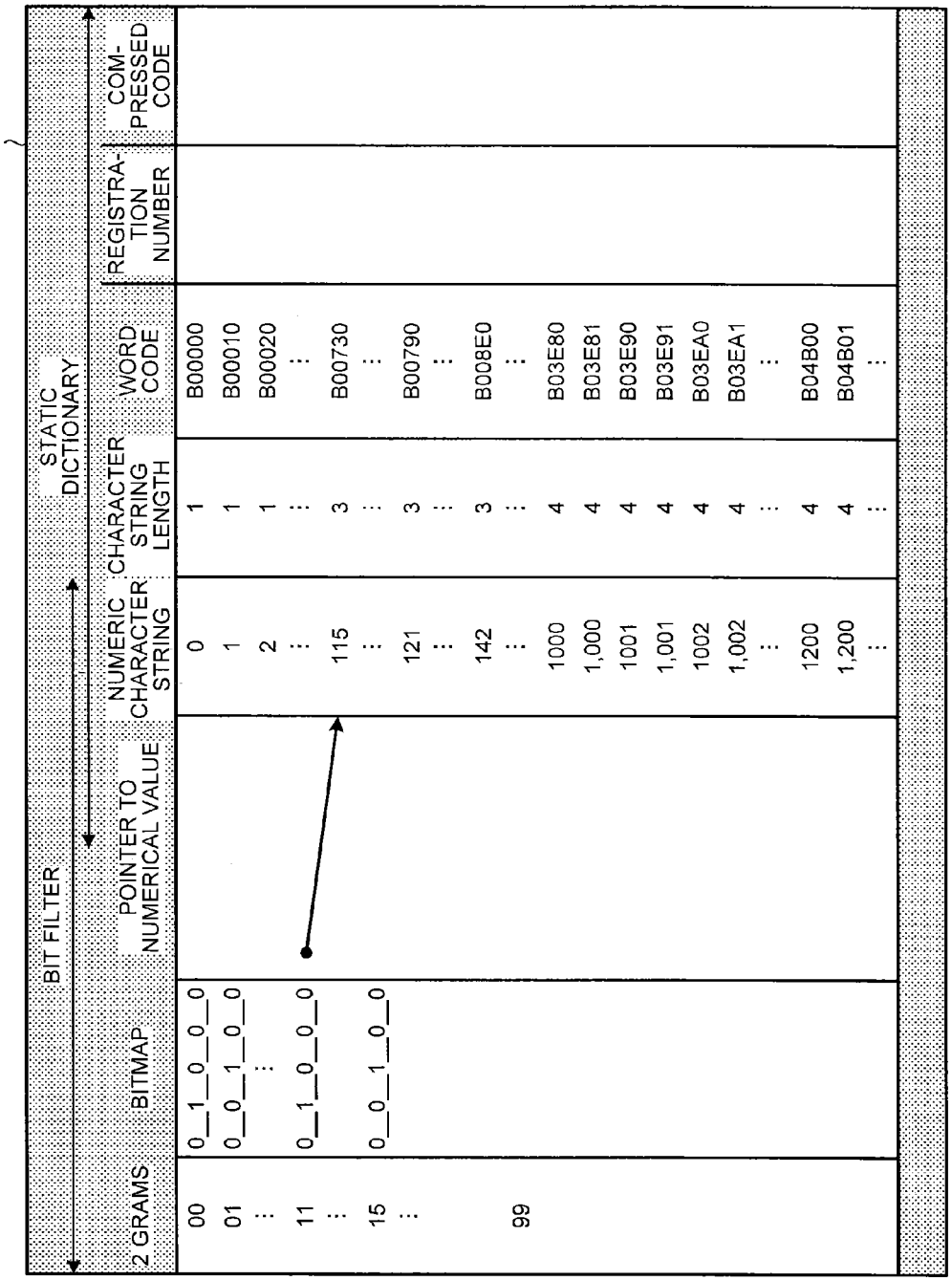
FIG. 7 is a schematic diagram illustrating a first example of a numeric unit in a bit filter.

The numeric unit 121a in the bit filter will be described. The bit filter 121a is a dictionary in which word codes and compressed codes are associated with numeric character strings. FIG. 7 is a schematic diagram illustrating a first example of a numeric unit in a bit filter. As in the example illustrated in FIG. 7, the bit filter 121a associates items of 2 grams, a bitmap, a numeric character string, a character string length, a word code, a registration number, and a compressed code. The item of "2 grams" is consecutive numerals included in each word. For example, "115" includes 2 grams associated with "11" and "15".

The "bitmap" represents a bitmap that is associated with the character string of 2 grams. For example, by a pointer to the numeric character string, "115" is associated with the bitmap "0_1_0_0_0" of 2 grams "11" and associated with the bitmap "0_0_1_0_0" of 2 grams "15". For example, if the information processing apparatus 100 acquires "115" from a target file, the information processing apparatus 100 accesses the numeric character string "115" by using the bitmap "0_1_0_0_0" of 2 grams "11" and the bitmap "0_0_1_0_0" of 2 grams "15".

The "numeric character string" is a numeric character string registered in the bit filter 121a. For the "numeric character string", numeric character strings are registered with sequence numbers, such as "0", "1", "2", ..., "100", "101", "999", and "1000", .... Furthermore, the "numeric character string" may also include a numeric character string that includes therein a comma "," every three digits. For example, as in the example illustrated in FIG. 7, the bit filter 121a includes "1,000", "1,001", and "1,002", ... as character strings each of which includes therein a comma. Furthermore, the "numeric character string" may also include a value, such as a negative value or a value after the decimal point. The "character string length" is the number of digits of each numeric character string.

The "word code" is a code allocated to each numeric character string. The "word codes" are sequentially allocated in ascending order of the numerical values. For example, for the "word code", the word codes "B00000h", "B00010h", "B00020h", and "B00030h" ... are sequentially allocated to the numeric character strings "0", "1", "2", "3", and "4" ... enumerated, respectively, in ascending numeric order. The last digit of the word code that is represented by six-digit hexadecimal numbers is information bit indicating the distinction between a half width and a full width, indicating the presence or absence of a comma, indicating the presence or absence of a decimal point, indicating the distinction between a positive value and a negative value, or the like. The area corresponding to the last two digits or more of the word code is associated with a numeric character string. In this way, by allocating word codes of numeric character strings to the numeric character strings in ascending order, it is possible to allocate word codes to numeric character strings in accordance with the size of each of the numeric character strings.

Furthermore, for the "word code", if the bit filter 121a includes therein numeric character strings each of which includes therein one of a comma, a negative value, and a value after the decimal point, a different word code is allocated to each of the numeric character strings. For example, as in the example illustrated in FIG. 7, the word code "B03E80h" is allocated to "1000" and the word code "B03E81h" is allocated to "1,000". Furthermore, the example illustrated in FIG. 7 indicates a case in which data of each of the items is associated as a record; however, the data may also be stored in another way as long as the above described relationship between the items that are associated with each other is maintained. The same applies to the bit filter and the dynamic dictionary indicated in FIGS. 9 to 11, which will be described later. Furthermore, the "registration number" and the "compressed code" will be described in detail later.

Figure 8:
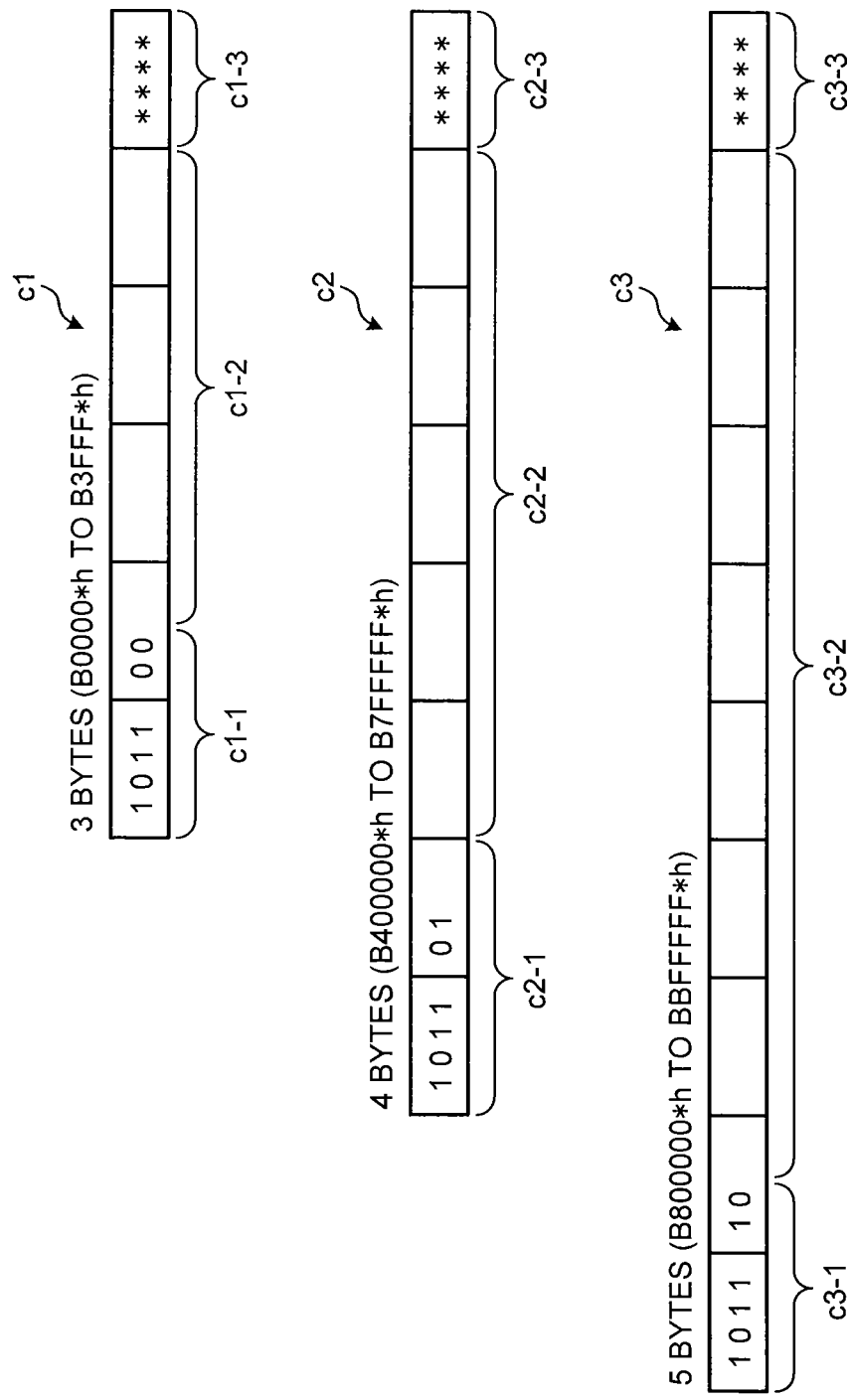
FIG. 8 is a schematic diagram illustrating an example of the data structure of word codes allocated to numeric character strings.

An example of a word code allocated to each of the numeric character strings will be described. FIG. 8 is a schematic diagram illustrating an example of the data structure of word codes allocated to numeric character strings. In the bit filter 121a, each of a 3-byte, a 4-byte, and a 5-byte word codes are previously allocated to the numeric character strings. The example illustrated in FIG. 8 indicates a code scheme of each of the 3-byte, the 4-byte, and the 5-byte word codes.

As in the example illustrated in FIG. 8, a word code c1 is a 3-byte code and includes a code area between "B0000h" and B3FFFh". The word code c1 includes a c1-1 area, a c1-2 area, and a c1-3 area. The c1-1 area includes fixed bits of "101100" indicating a 3-byte code. The c1-2 area includes bits that are associated with the integers from 0 to 16,383. The symbol of "****" in the c1-3 area is information bit indicating the distinction between a half width and a full width, indicating the presence or absence of a comma, indicating the presence or absence of a decimal point, indicating the distinction between a positive value and a negative value, or the like. For example, if the last bit in the c1-3 area is "0", this indicates that no comma is included in a numeric character string, whereas, if the last bit in the c1-3 area is "1", this indicates that a comma is included in the numeric character string. The same applies to the c2-3 and c3-3 areas.

The word code c2 is a 4-byte code and includes a code area between "B400000h and B7FFFFFh". The word code c2 includes a c2-1 area, a c2-2 area, and a c2-3 area. The c2-1 area includes fixed bits of "101101" indicating a 4-byte code. The c2-2 area includes bits that are associated with the integers from 16,384 to 1,048,575. Similarly to the c1-3 area, the symbol of "**" in the c2-3 area is information bit. The word code c3 is a 5-byte code and includes a code area between "B800000h and BBFFFFFh". The c3-1 area includes fixed bits of "101001" indicating a 5-byte code. The c3-2 area includes bits associated with the integers from 1,048,576 to 1,073,741,823. Similarly to the c1-3 area, the symbol of "**" in the c3-3 area is information bit. Furthermore, the 3-byte code, the 4-byte code, and the 5-byte code may also include, in addition to the integers, a numerical value that includes a decimal point, a negative numerical value, a numerical value that includes a comma, or the like.

Figure 9:
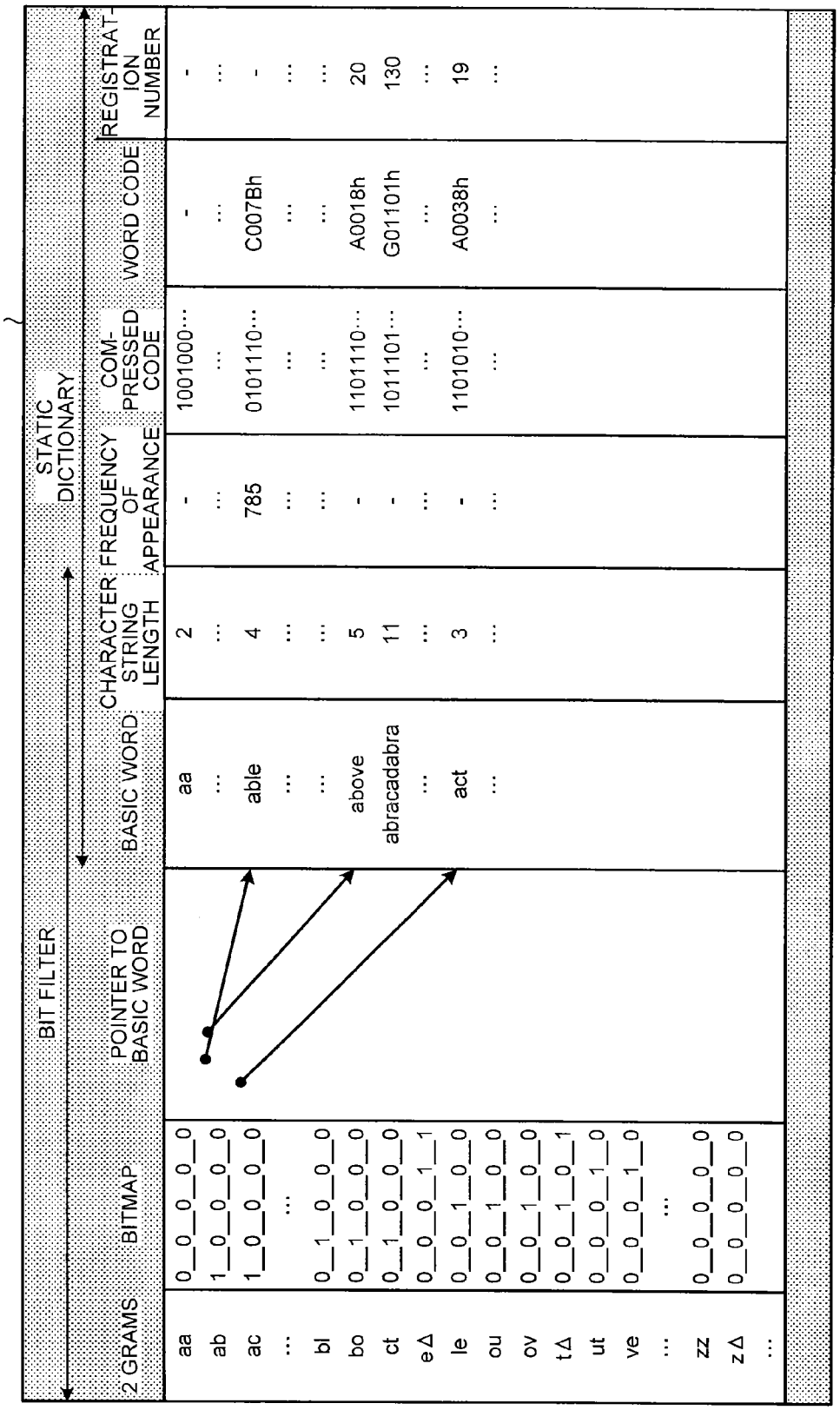
FIG. 9 is a schematic diagram illustrating an example of a word unit in the bit filter.

In the following, the word unit $121b$ in the bit filter $121$ will be described. The word unit $121b$ in the bit filter $121$ is a dictionary in which word codes and compressed codes are associated with basic words. FIG. 9 is a schematic diagram illustrating an example of a word unit in the bit filter. As in the example illustrated in FIG. 9, the bit filter $121b$ associates items of 2 grams, a bitmap, a basic word, a character string length, the frequency of appearance, a compressed code, a word code, and a registration number. The items of the "2 grams" and the "bitmap" are the same as that in the bit filter $121a$; therefore, descriptions thereof will be omitted. The "basic word" is a word registered in the bit filter $121b$. For example, the "basic words" are 190,000 words that are previously extracted from dictionaries, text groups, or the like. An arbitrary number of words may be registered as the "basic words".

The "character string length" is the length of a character string of a basic word. The "frequency of appearance" is the number of times each of the basic words appears in an accumulation-of-appearance text file group. The accumulation-of-appearance text file group mentioned here is one or more text files that are used to accumulate the frequency of appearance of each of the basic words that are separately prepared from a target file.

Accumulating the frequency of appearance of a basic word will be described. The information processing apparatus 100 reads the accumulation-of-appearance text file, appropriately extracts words that are present in the accumulation-of-appearance text file group, and registers the words in the bit filter $121b$. Furthermore, for the each of the basic words registered in the bit filter $121b$, the information processing apparatus 100 counts, as the frequency of appearance, the number of times of appearances in the accumulation-of-appearance text file group. For example, in the example illustrated in FIG. 9, the bit filter $121b$ indicates that the basic word "able" appears "785" times in the accumulation-of-appearance text file group.

The "compressed code" is a compressed code allocated to each of the basic words. The information processing apparatus 100 allocates a compressed code with a smaller code length to a basic word that frequently appears. The "word code" is a code allocated to each word. The "registration number" is a number that is uniquely added to a compressed code when the compressed code is registered in the dynamic dictionary 122, which will be described later. The "registration number" indicates the order registered in, for example, the dynamic dictionary 122.

In the following, the dynamic dictionary 122 will be described. The dynamic dictionary 122 is a dictionary in which the word codes are associated with compressed codes that are added to the word codes. FIG. 10 is a schematic diagram illustrating an example of a dynamic dictionary. As in the example illustrated in FIG. 10, the dynamic dictionary 122 associates the compressed codes and the codes. The "codes" are word codes acquired by the bit filter $121a$ or the bit filter $121b$. The "compressed codes" are compressed codes with the fixed length sequentially added in ascending order to the word codes in the order the word codes are registered in, for example, the dynamic dictionary 122.

For example, if the information processing apparatus 100 sequentially extracts, from a target file, words and numeric character strings in the order of "order", "box", "1000", and "him" . . . , the information processing apparatus 100 allocates the compressed codes "A000h", "A001h", "A002h", and "A003h" . . . , respectively, to the words and the word codes of the numeric character strings. Then, the information processing apparatus 100 registers, in the dynamic dictionary 122, the compressed codes allocated to the words and the numeric character strings. For example, the information processing apparatus 100 associates, at the position of the offset "0x0000h", the compressed code of "A000h" and the word code of "order". Furthermore, the information processing apparatus 100 associates, at the position of the offset "0x0001h", the compressed code of "A001h" and the word code of "box". Furthermore, the information processing apparatus 100 associates, at the position of the offset "0x0002h", the compressed code of "A002h" and the word code of "1000". Furthermore, in FIG. 10, the sign represented by "c (word)" indicates a word code that is associated with the numeric character string or the word represented in the parentheses. For example, "c (order)" indicates the word code of "order".

Each Configuration in the Compressing Unit

Each configuration in the compressing unit 110 will be described. The file read unit 111 is a processing unit that reads a target file and that extracts words and numeric character strings from the target file. The file read unit 111 divides a character string into each word or numeric character string by using a blank character in the character string in the target file and then extracts each of the words and the numeric character strings from the target file. The file read unit 111 outputs the extracted words and the numeric character strings to the compressed code adding unit 112.

The compressed code adding unit 112 is a processing unit that adds a compressed code to each of the words and the numeric character strings extracted from the target file. When the compressed code adding unit 112 receives a numeric character string from the file read unit 111, the compressed code adding unit 112 accesses the "numeric character strings" that are registered in the bit filter $121a$.

If the compressed code associated with one of the accessed "numeric character strings" has already been registered in the bit filter $121a$, the compressed code adding unit 112 acquires the compressed code associated with the numeric character string from the bit filter $121a$ and outputs the compressed code to the file write unit 113.

In contrast, if the associated compressed code has not been registered in the accessed "numeric character strings" in the bit filter $121a$, the compressed code adding unit 112 acquires the word code associated with the numeric character string from the bit filter $121a$. Then, the compressed code adding unit 112 associates the word code acquired from the bit filter $121a$ with one of the compressed codes that are sequentially added to the dynamic dictionary 122 in the order of registration and then registers the association result in the dynamic dictionary 122.

A specific example in which a compressed code is registered in the dynamic dictionary 122 will be described with reference to FIG. 10. As in the example illustrated in FIG. 10, the compressed code adding unit 112 associates the compressed code "A002h" with the word code "1000", which is registered as the third registration, and then registers the word code "1000" in the dynamic dictionary 122. Furthermore, the compressed code adding unit 112 associates the compressed code "A005h" with the word code "1,200", which is registered as the sixth registration, and then registers the word code "1,200" in the dynamic dictionary 122. In this way, the compressed code adding unit 112 adds compressed codes associated with the word codes in the numeric character strings in the order the word codes are sequentially registered in the dynamic dictionary 122; associates the word codes in the numeric character string with the added compressed codes; and registers the association relationship in the dynamic dictionary 122.

Then, the compressed code adding unit 112 associates the compressed codes registered in the dynamic dictionary 122 with the word codes and registers the association relationship in the bit filter 121a. Furthermore, the compressed code adding unit 112 adds registration numbers to the registered compressed codes; associates the registration numbers with the compressed codes; and registers the association relationship in the dynamic dictionary 122. The registration numbers mentioned here are numbers indicating the order the word codes are registered in the dynamic dictionary 122.

A specific example of the bit filter 121a after the registration numbers and the compressed codes are registered will be described with reference to FIG. 11. FIG. 11 is a schematic diagram illustrating a second example of the numeric unit in the bit filter. As in the example illustrated in FIG. 11, the registration numbers and the compressed codes are registered in the bit filter 121a. In the bit filter 121a, the "registration number" is a number indicating the order of word codes registered in the dynamic dictionary 122. The "compressed code" is a compressed code associated with a numeric character string. For example, in the bit filter 121a, the registration number "15" associated with the numeric character string "115" indicates that the compressed code "A017" related to the numeric character string "115" is registered as the 15$^{th}$ registration in the dynamic dictionary 122. In the bit filter 121a, the compressed code "A017h" that is added to the numeric character string "115" is registered. Furthermore, in the bit filter 121a, the registration number "12" associated with the numeric character string "121" indicates that the compressed code "A00E" related to the numeric character string "121" is registered as the 12$^{th}$ registration in the dynamic dictionary 122. In the bit filter 121a, the compressed code "A00Eh" added to the numeric character string "121" is registered.

Then, the compressed code adding unit 112 outputs the compressed codes registered in the bit filter 121a to the file write unit 113.

The file write unit 113 is a processing unit that creates a compressed file based on the compressed codes output from the compressed code adding unit 112. The file write unit 113 stores each of the compressed codes of the numeric character strings or the words output from, for example, the compressed code adding unit 112 in a buffer and creates compressed data. The file write unit 113 creates a compressed file based on the compressed data created in the buffer.

Flow of the Compression Process According to the First Embodiment

Figure 12:
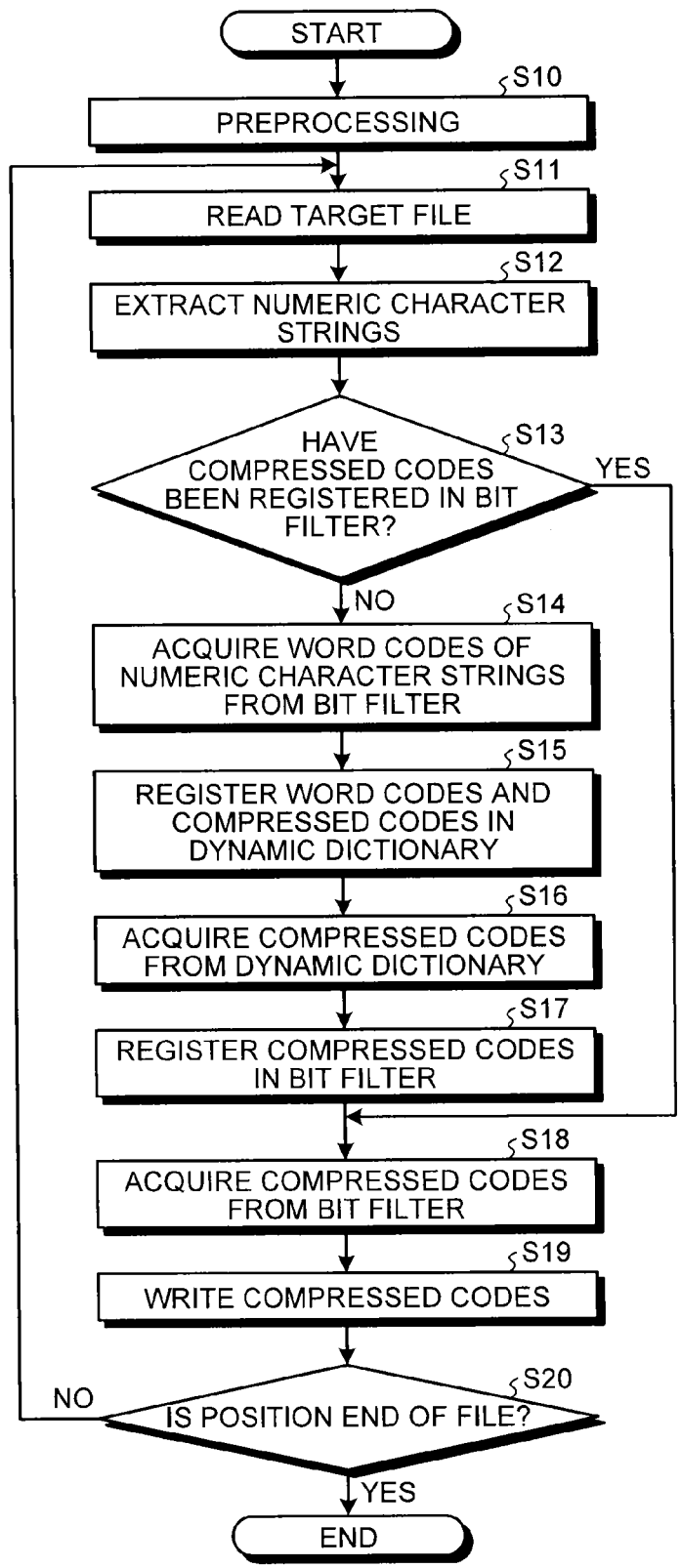
FIG. 12 is a flowchart illustrating the flow of the compression process according to the first embodiment.

In the following, the flow of the compression process according to the first embodiment will be described. FIG. 12 is a flowchart illustrating the flow of the compression process according to the first embodiment. As in the example illustrated in FIG. 12, the information processing apparatus 100 performs preprocessing (Step S10). For example, in the preprocessing, the information processing apparatus 100 reserves an area for holding the bit filter 121 or a work area for creating the dynamic dictionary 122. The file read unit 111 reads a target file (Step S11) and extracts numeric character strings from the target file (Step S12).

The compressed code adding unit 112 determines whether the compressed codes associated with the numeric character strings that are extracted from the target file have been registered in the bit filter 121a (Step S13). If the compressed codes have been registered in the compressed code (Yes at Step S13), the compressed code adding unit 112 proceeds to the process at Step S18.

In contrast, if the compressed codes have not been registered in the bit filter 121a (No at Step S13), the compressed code adding unit 112 acquires word codes from the bit filter 121a (Step S14). Then, the compressed code adding unit 112 associates the word codes acquired from the bit filter 121a with the compressed codes that are sequentially added to word codes in the order the word codes are registered in the dynamic dictionary 122 and then registers the association relationship in the dynamic dictionary 122 (Step S15). For example, the compressed code adding unit 112 adds compressed codes "A000h", "A001h", "A002h", "A003h", "A004h", and "A005h" . . . to the word codes in the order the word codes are registered in the dynamic dictionary 122. The compressed code adding unit 112 acquires the compressed codes registered in the dynamic dictionary 122 (Step S16). Then, the compressed code adding unit 112 associates the compressed codes acquired from the dynamic dictionary 122 with the word codes and registers the association relationship in the bit filter 121a (Step S17).

The compressed code adding unit 112 acquires the compressed codes associated with the numeric character strings from the bit filter 121a (Step S18). The file write unit 113 writes the compressed codes acquired from the bit filter 121a into the compressed file (Step S19).

The file read unit 111 determines whether the read position of the file is the end of the file (Step S20). If the read position of the file is the end of the file (Yes at Step S20), the file read unit 111 ends the process. In contrast, if the read position of the file is the midpoint of the file (No at Step S20), the file read unit 111 returns to the process at Step S11.

As described above, because the information processing apparatus 100 according to the first embodiment allocates a compressed code to each of the numeric character strings included in a target file, it is possible to decrease the code length that is allocated to a numeric character string at the time of the compression process.

Advantage of the First Embodiment

The compressing unit 110 extracts, from input data, a numeric character string that indicates a numerical value and that includes therein at least one numeral. The compressing unit 110 refers to the dictionary that stores therein, in an associated manner, numeric character strings and compressed codes and converts into the compressed code associated with the extracted numeric character string. Consequently, when the compression process is performed, the code length to be allocated to the numeric character string can be decreased.

The dictionary includes therein the first dictionary in which a predetermined plurality of numeric character strings are previously stored and the second dictionary in which the numeric character strings registered in the first dictionary are stored. If the extracted numeric character string is registered in the first dictionary and the compressed code associated with the extracted numeric character string is not registered in the first dictionary, the compressing unit 110 adds a compressed code to the extracted numeric character string, associates the compressed code with the extracted numeric character string in the first dictionary, and registers the extracted compressed code. Consequently, compression can be performed while compressed code are dynamically added only to the input numerical values and thus the length of the compressed code can be reduced when compared with a case in which compressed codes are previously allocated to all of the numerical values that can be extracted.

The first dictionary is a dictionary in which, in addition to the numeric character strings that can be extracted, codes that are sequentially allocated in accordance with the order of the magnitude of the numerical values are further associated. Consequently, the magnitude of the numerical values can be compared each other in a state of codes.

[b] Second Embodiment

Figure 13:
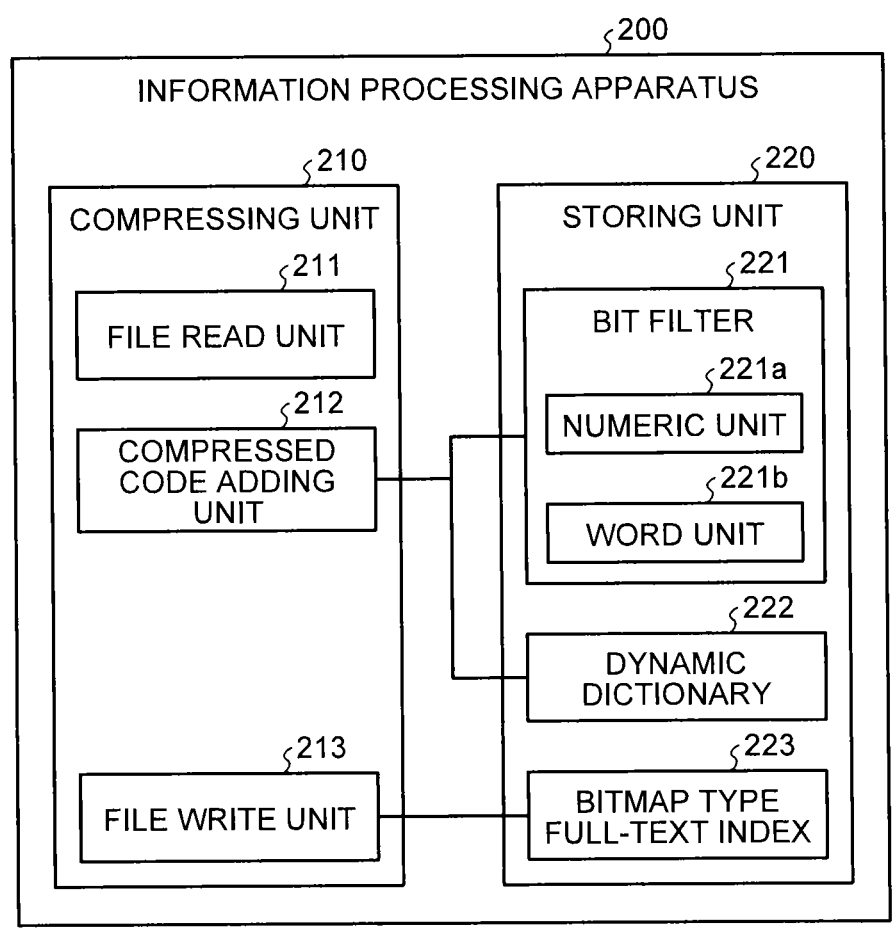
FIG. 13 is a schematic diagram illustrating an example of the system configuration related to a compression process according to a second embodiment.

The system configuration related to a compression process according to the second embodiment will be described with reference to FIG. 13. FIG. 13 is a schematic diagram illustrating an example of the system configuration related to a compression process according to a second embodiment. As in the example illustrated in FIG. 13, an information processing apparatus 200 includes a compressing unit 210 and a storing unit 220. The compressing unit 210 includes a file read unit 211, a compressed code adding unit 212, and a file write unit 213. The storing unit 220 includes a bit filter 221, a dynamic dictionary 222, and a bitmap type full-text index 223. The bit filter 221 includes a numeric unit 221a and a word unit 221b. The components having the same configuration as that in the first embodiment are assigned the reference numerals with the same last two digits and descriptions of such components are appropriately omitted.

When numeric character strings are extracted in an extracting process, the compressing unit 210 updates an index that holds therein, for each numeric character string from among a plurality of compressed files, information bit strings that indicate a compressed file in which the numeric character strings are included. In the following, the configuration of the compressing unit 210 and the storing unit 220 according to the second embodiment will be described.

Figure 14:
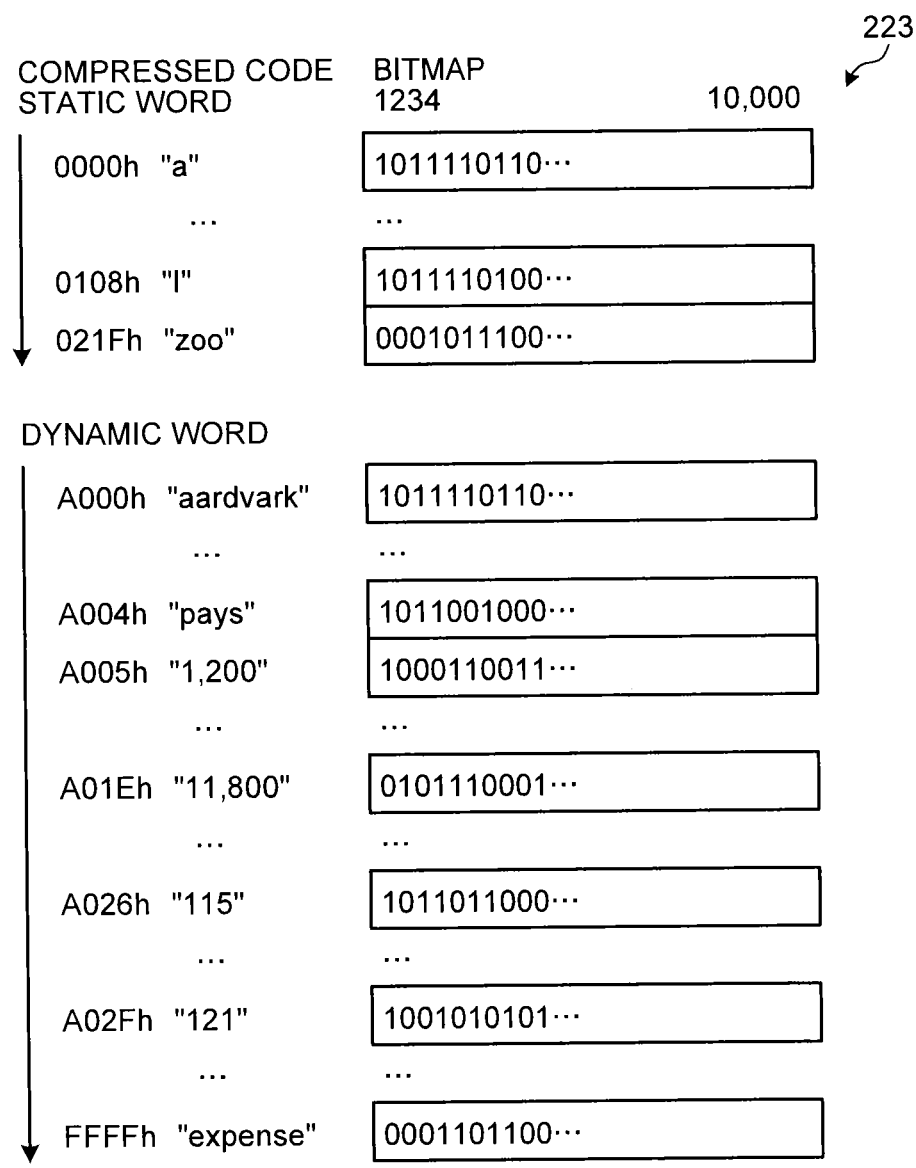
FIG. 14 is a schematic diagram illustrating an example of a bitmap type full-text index.

The information processing apparatus 200 according to the second embodiment differs from the information processing apparatus 100 in the first embodiment in that the storing unit 220 includes the bitmap type full-text index 223. The data structure of the bitmap type full-text index 223 will be described with reference to FIG. 14. FIG. 14 is a schematic diagram illustrating an example of a bitmap type full-text index. As in the example illustrated in FIG. 14, the bitmap type full-text index 223 associates a bitmap for each compressed code related to a static word and a dynamic word. The bitmap is a code bit string indicating whether which compressed file includes therein a static word and a dynamic word. Namely, each of the bits in a bitmap indicates whether a static word or a dynamic word is included in each of the compressed files.

The bitmap type full-text index 223 associates bitmap for, for example, every static words of 8000 types and every dynamic words of 24000 types. The static words mentioned here indicate words that are frequently appear when the frequency of appearance of each word is accumulated in an accumulation-of-appearance text file group. For example, the static words are top 8000 words that frequently appear in an accumulation-of-appearance text file group. Furthermore, the dynamic words mentioned here indicate numeric character strings or words that are extracted from a target file and the order of the frequency of appearance in the accumulation-of-appearance text file group is less than 8000.

For example, in the first line of the valid line in the bitmap type full-text index 223, the bitmap of "a" associated with the compressed code "0001h" is "1011110110 . . . ". The first line of the valid line in the bitmap type full-text index indicates the file that includes therein the compressed code of "a". The bitmap "1011110110 . . . " indicates that, because "1" is stored in the first bit, "a" is included in a file 1; indicates that, because "0" is stored in the second bit, "a" is not included in a file 2; and indicates that, because "1" is stored in the third bit, "a" is included in a file 3. Furthermore, the bitmap "1011110110 . . . " indicates that, because "1" is stored in the fourth bit, "a" is included in a file 4 and indicates that, because "1" is stored in the fifth bit, "a" is included in a file 5. Furthermore, the bitmap "1011110110 . . . " also indicates whether "a" is included in a file 6 and in each of the subsequent the other files.

In the following, an update of the bitmap type full-text index 223 will be described. The file write unit 213 determines whether the compressed code received from the compressed code adding unit 212 is registered in the bitmap type full-text index 223. If the bitmap associated with the received compressed code is registered in the bitmap type full-text index 223, the file write unit 213 refers to the bitmap associated with the received compressed code. If the bit associated with the target file is "0" in the referred bitmap, the file write unit 213 updates the bit to "1". However, if the bit associated with the target file is "1", the file write unit 213 does not update the bitmap.

In contrast, if the bitmap associated with the received compressed code is not registered in the bitmap type full-text index 223, the file write unit 213 newly registers the bitmap in the bitmap type full-text index 223.

Specifically, if the compressed code adding unit 212 registers, in the dynamic dictionary 222, words or numeric character strings included in a target file, the file write unit 213 acquires compressed codes that are added to the words or the numeric character strings. In such a case, the file write unit 213 registers the bitmaps related to the acquired compressed codes in the bitmap type full-text index 223. The bitmaps include therein the number of bits of "0" corresponds to the number of target files. Furthermore, from among bits in the registered bitmaps, the file write unit 213 updates the bits associated with the target file to "1". Namely, when the file write unit 213 registers, in the dynamic dictionary 222, the word or the numeric character string that appears in the target file first time, the file write unit 213 registers the bitmap that is associated with the word or the numeric character string registered in the bitmap type full-text index 223. In this way, the bitmap type full-text index 223 is created.

Flow of a Compression Process According to the Second Embodiment

Figure 15:
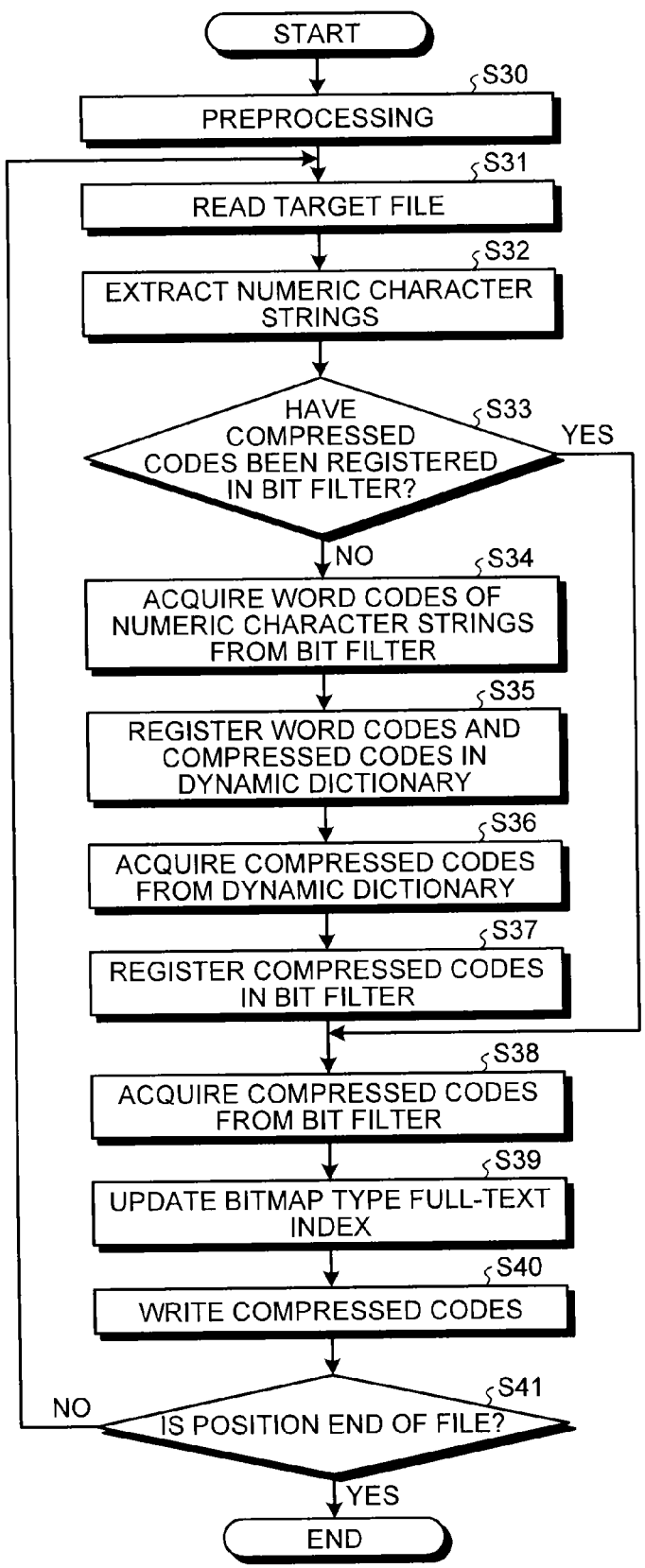
FIG. 15 is a flowchart illustrating the flow of the compression process according to the second embodiment.

In the following, the flow of a compression process according to the second embodiment will be described. FIG. 15 is a flowchart illustrating the flow of the compression process according to the second embodiment. As in the example illustrated in FIG. 15, the information processing apparatus 200 performs preprocessing (Step S30). For example, the information processing apparatus 200 reserves, as the preprocessing, a work area for creating the bitmap type full-text index 223. The file read unit 211 reads a target file (Step S31) and extracts numeric character strings from the target file (Step S32).

If a compressed code associated with the numeric character strings that are extracted from the target file have been registered in the bit filter 221a (Yes at Step S33), the compressed code adding unit 212 proceeds to the process at Step S38.

In contrast, if the compressed codes associated with the numeric character strings extracted from the target file have not been registered in the bit filter 221a (No at Step S33), the compressed code adding unit 212 acquires word codes of the numeric character strings from the bit filter 221a (Step S34). The compressed code adding unit 212 associates the acquired word codes with the compressed codes that are sequentially added in the order word codes are registered in the dynamic dictionary 222 and then registers the association relationship in the dynamic dictionary 222 (Step S35). The compressed code adding unit 212 acquires the compressed codes registered in the dynamic dictionary 222 (Step S36). The compressed code adding unit 212 registers the compressed codes acquired from the dynamic dictionary 222 in the bit filter 221a (Step S37). The compressed code adding unit 212 acquires compressed codes from the bit filter 221a (Step S38).

The file write unit 213 updates the bitmap type full-text index 223 based on the compressed codes acquired by the compressed code adding unit 212 (Step S39). For example, if a bitmap associated with the compressed code is registered in the bitmap type full-text index 223, the file write unit 213 updates the bit associated with the target file to "1" from among the bits included in the bitmap. In contrast, if a bitmap associated with the compressed code is not registered in the bitmap type full-text index 223, the file write unit 213 newly registers a bitmap associated with the compressed code in the bitmap type full-text index 223.

The file write unit 213 writes the compressed codes acquired by the compressed code adding unit 212 in the compressed file (Step S40).

The file read unit 211 determines whether the read position of the file is the end of the file (Step S41). If the read position of the file is the end of the file (Yes at Step S41), the file read unit 211 ends the process. In contrast, if the read position of the file is the midpoint of the file (No at Step S41), the file read unit 211 returns to the process at Step S31.

As described above, the information processing apparatus 200 according to the second embodiment creates the bitmap type full-text index 223 when files are compressed. Consequently, when a numeric character string search is performed based on a plurality of compressed files, the information processing apparatus 200 can specify a file that includes therein a numeric character string that is targeted for the search and thus narrow down the compressed files to be opened; therefore, it is possible to speed up the numeric character string search.

Advantage of the Second Embodiment

If a numeric character string is extracted in an extracting process, the compressing unit 210 updates an index that stores therein, in an associated manner for each numeric character string from among a plurality of compressed files, an information bit string that indicates a compressed file in which a numeric character string is included. Consequently, when a numeric character string search is performed based on a plurality of compressed files, it is possible to specify a file that has the numeric character string targeted for the search and narrow down the compressed files to be opened; therefore, it is possible to speed up the numeric character string search.

[c] Third Embodiment

If numerical values are compressed in a state in which compression is performed in units of numerals such that small-and-large comparison can be performed, because each of the numerals of 0, 1, or the like, in which the frequency of appearance is high and the numerals of 8, 9, or the like, in which the frequency of appearance is low need to be compressed to the same code length and because a short code is allocated to a numeral with low frequency of appearance, the compression ratio is reduced as the entire of a compressed file.

For example, if a 4-bit code length is allocated to each numeral from 0 to 9, the code length that is equal to a character or a word with the frequency of appearance of "0.0625" and thus the numeral with the low frequency of appearance, such as 8, 9, or the like, is treated as a character or a word with the high frequency of appearance. Consequently, because an area of compressed codes related to other characters or words is reduced and thus the code length that is to be allocated to the other characters or words is corrected such that the code length is increased, there is a problem in that the compression ratio is decreased as the entire of the compressed file.

Figure 16:
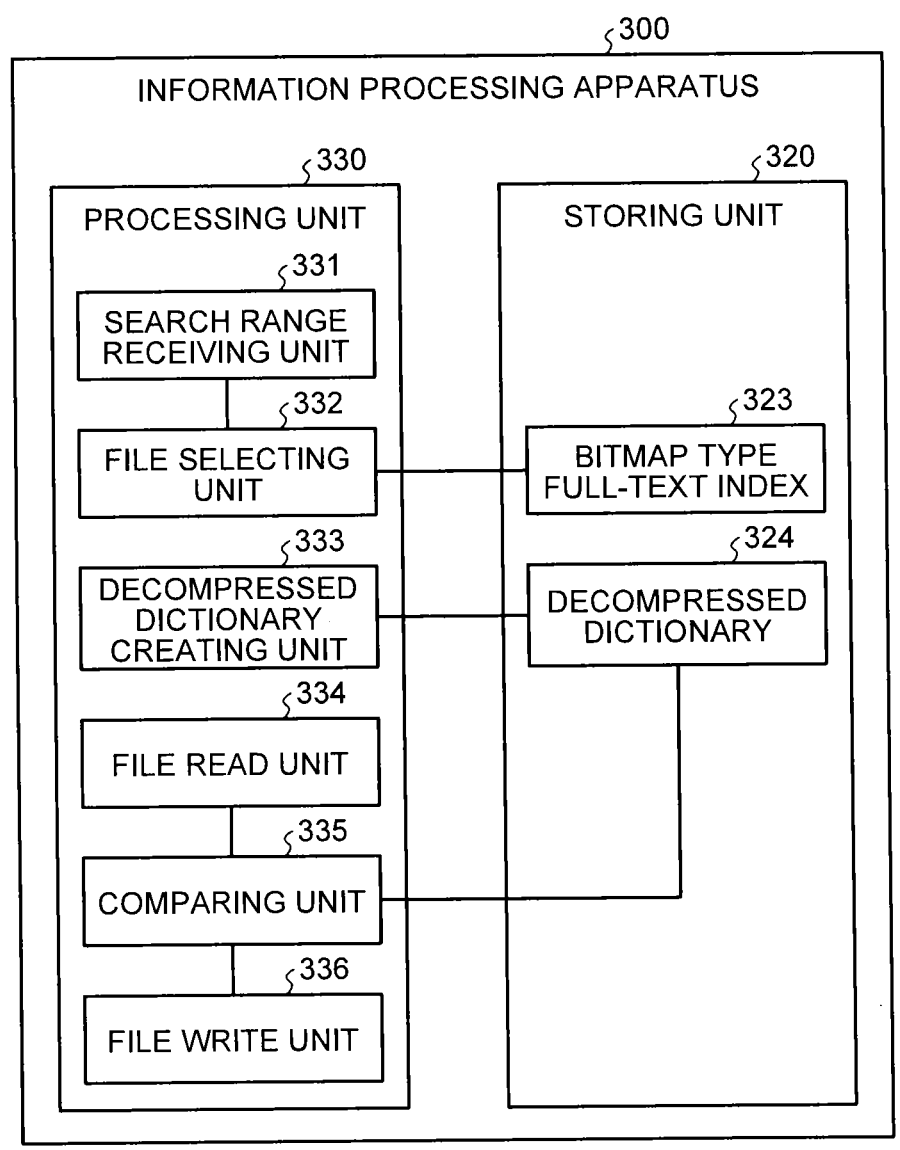
FIG. 16 is a schematic diagram illustrating an example of the system configuration related to a small-and-large comparing process according to a third embodiment.

The system configuration related to the small-and-large comparing process according to the third embodiment will be described with reference to FIG. 16. FIG. 16 is a schematic diagram illustrating an example of the system configuration related to a small-and-large comparing process according to a third embodiment. As in the example illustrated in FIG. 16, an information processing apparatus 300 includes a processing unit 330 and a storing unit 320. The processing unit 330 includes a search range receiving unit 331, a file selecting unit 332, a decompression dictionary creating unit 333, a file read unit 334, a comparing unit 335, and a file write unit 336. The storing unit 320 includes a bitmap type full-text index 323 and a decompression dictionary 324.

The storing unit 320 is, for example, a semiconductor memory device, such as a RAM, a ROM, a flash memory, and the like, or a storage device, such as a hard disk, an optical disk, and the like. Furthermore, the functions performed by the processing unit 330 can be implemented by, for example, a CPU executing a predetermined program. Furthermore, the functions performed by the processing unit 330 can be implemented by, for example, an integrated circuit, such as an ASIC, an FPGA, or the like. The data structure of the bitmap type full-text index 323 is the same as that in the first embodiment or the second embodiment; therefore, a description thereof will be omitted.

The processing unit 330 converts the compressed code extracted from a compressed file to a code by using a dictionary in which, in addition to a numeric character string that indicates a numerical value and that includes therein at least one numeral, codes that are sequentially allocated in accordance with the order of the magnitude of numerical values and compressed codes are stored in an associated manner. The processing unit 330 determines whether the converted code is included in the search range by comparing the converted code with one or more codes associated with the search range of the numeric character strings. If the processing unit 330 determines that the converted code is included in the search range, the processing unit 330 decompresses the converted code to a numeric character string and displays the decompression result.

Furthermore, the processing unit 330 specifies, by using index that includes therein information related to compressed files that include therein numeric character strings, a compressed file that includes therein a numeric character string within the search range. In the following, the configuration of the processing unit 330 and the storing unit 320 according to the third embodiment will be described in detail.

The search range receiving unit 331 is a processing unit that receives the range of a numeric character string search that is input by a user. The search range receiving unit 331 receives the range of the numeric character string search by acquiring, for example, the maximum value and the minimum value of the search range that is input in an input format. The search range mentioned here is the range of the numeric character string belonging to the specified maximum value and the minimum value. The search range receiving unit 331 outputs, to the file selecting unit 332 and the comparing unit 335, the received maximum value and the minimum value as a search range.

The file selecting unit 332 is a processing unit that selects a compressed file that includes therein a numeric character string in a search range by using the bitmap type full-text index 323. The file selecting unit 332 extracts, from the bitmap type full-text index 323, one or more bitmaps associated with the compressed codes in the search range. Then, by performing an OR operation between one or more extracted bitmaps, the file selecting unit 332 creates a selection result map. The selection result map mentioned here is a bitmap that indicates a compressed file that includes therein one or more numeric character strings in the search range. The file selecting unit 332 outputs the selection result map to the file read unit 334.

Figure 17:
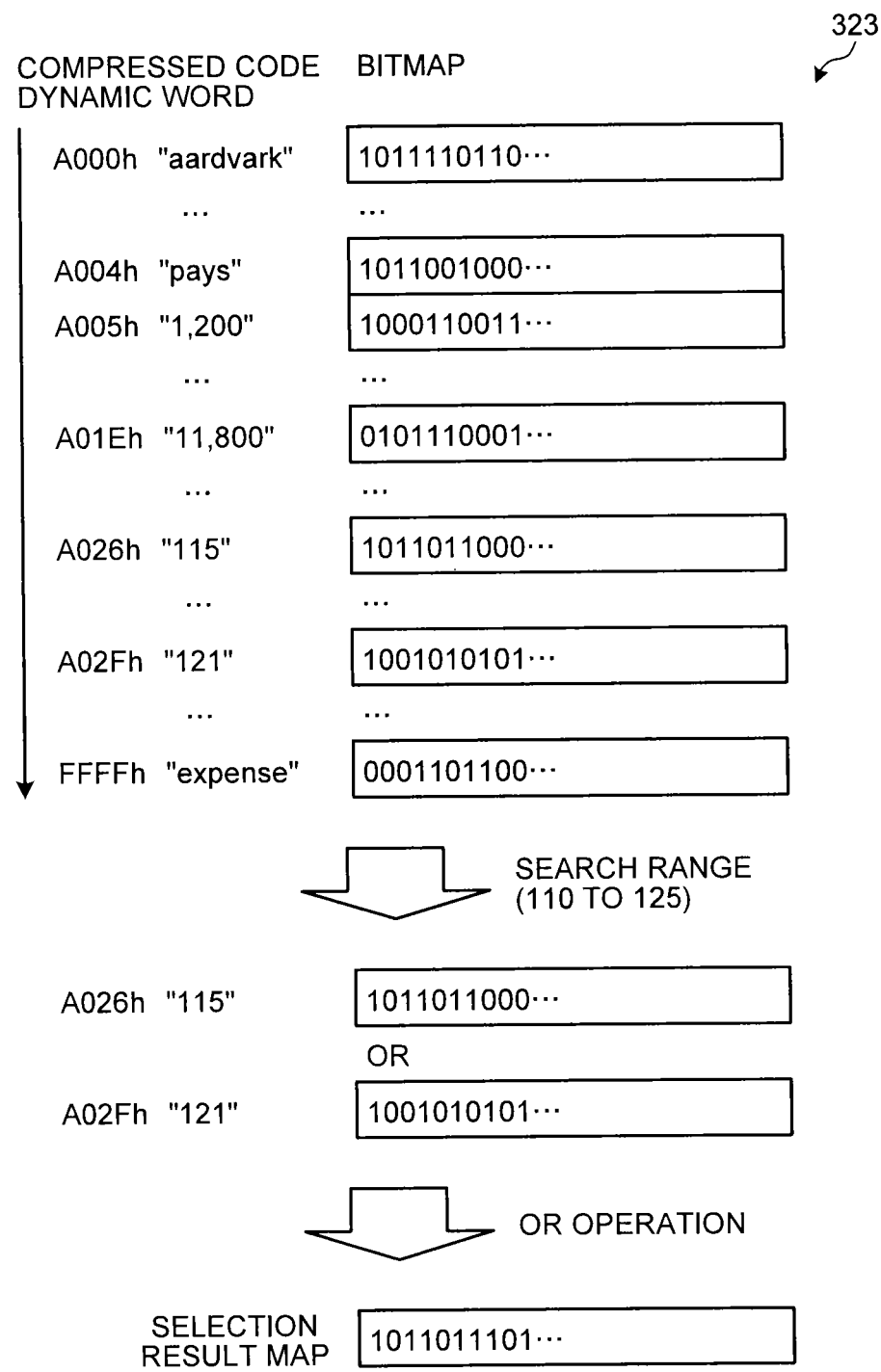
FIG. 17 is a first diagram illustrating the flow of a selecting process of a compressed file.

In the following, the flow of a process of creating a selection result map will be described with reference to FIG. 17. FIG. 17 is a first diagram illustrating the flow of a selecting process of a compressed file. The example illustrated in FIG. 17 indicates the portions associated with dynamic words in the bitmap type full-text index 323. As in the example illustrated in FIG. 17, if the search range is, for example, from 110 to 125, the file selecting unit 332 extracts the bitmap of "115" and the bitmap of "121" belonging within the search range. Then, the file selecting unit 332 performs the OR operation between the bitmap "1011011000 . . . " of "115" and the bitmap "1001010101 . . . " of "121" and creates the selection result map "1011011101 . . . ". The selection result map "1011011101 . . . " created by the file selecting unit 332 indicates each of the compressed files that includes therein one of or both the numeric character string "115" and "121".

If three or more bitmaps belonging within the search range are present in the bitmap type full-text index 323, the file selecting unit 332 performs the OR operation on each of the bitmaps and creates a selection result map. For example, if a bitmap A, a bitmap B, and a bitmap C belong within the search range, the file selecting unit 332 creates a selection result map by performing calculation by using the condition expression (A or B) or C.

Furthermore, when the file selecting unit 332 specifies a bitmap in a search range in the bitmap type full-text index 323, the file selecting unit 332 may also use a small-and-large comparison method, which will be described later.

Figure 18:
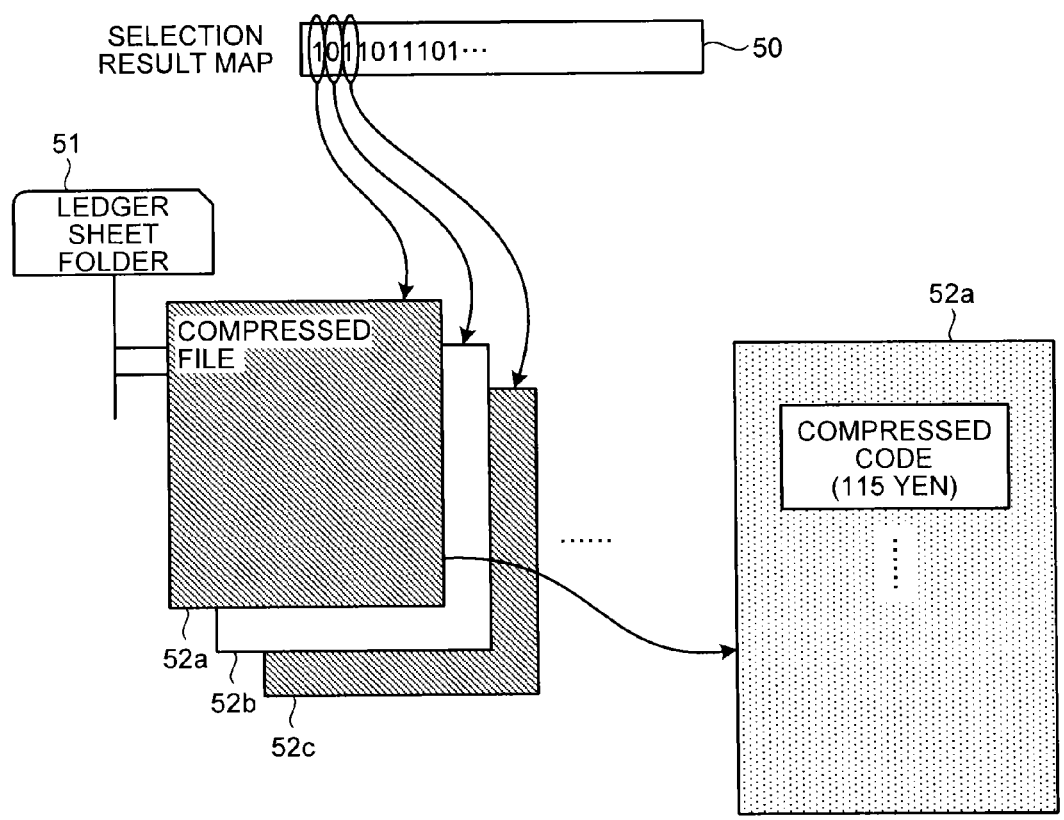
FIG. 18 is a second diagram illustrating the flow of the selecting process of a compressed file.

In the following, the flow of a process of selecting a compressed file will be described with reference to FIG. 18. FIG. 18 is a second diagram illustrating the flow of the selecting process of a compressed file. As in the example illustrated in FIG. 18, a ledger sheet folder 51 includes therein a plurality of compressed files 52*a*, 52*b*, and 52*c*, or the like. Because a selection result map 50 indicates "1011011101 . . . ", the file selecting unit 332 opens, from among the files included in the ledger sheet folder 51, the first file of the compressed file 52*a* and the third file of the compressed file 52*c*. Furthermore, in addition to these files, the file selecting unit 332 also opens the fourth file, the sixth to eighth files, and the 10$^{th}$ file. The compressed file 52*a* that has been opened by the file selecting unit 332 stores therein a compressed code related to "115 (Yen)" as a compressed code that is related to the numeric character string belonging to, for example, the search range 110 to 125.

Figure 19:
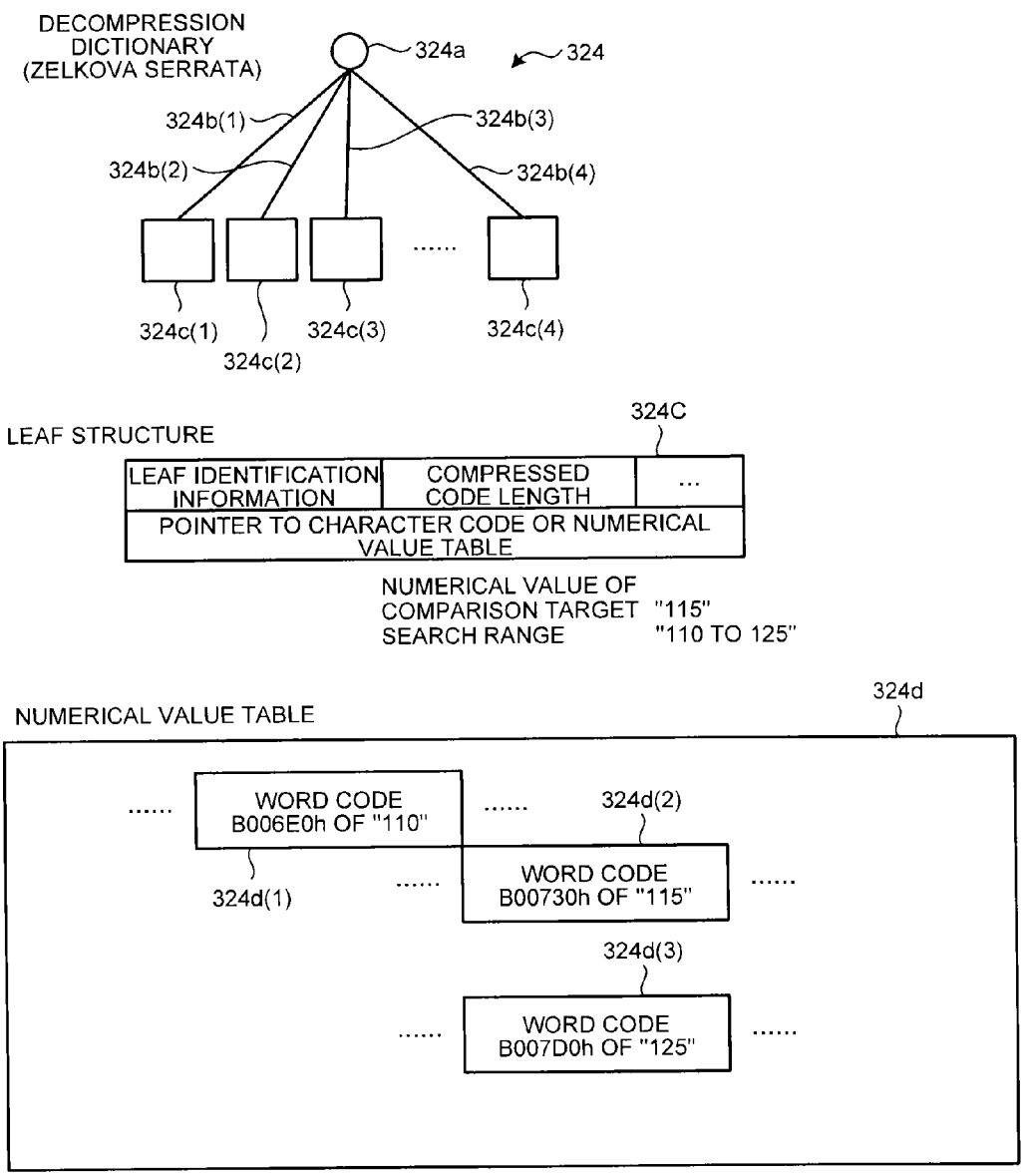
FIG. 19 is a schematic diagram illustrating the structure of a decompression dictionary.

The decompression dictionary creating unit 333 is a processing unit that creates the decompression dictionary 324. The decompression dictionary creating unit 333 creates the decompression dictionary 324 based on the compressed data included in the compressed file. FIG. 19 is a schematic diagram illustrating the structure of a decompression dictionary. As in the example illustrated in FIG. 19, the decompression dictionary 324 includes a root 324*a*, branches 324*b*(1) to 324*b*(4), and leaves 324*c*(1) to 324*c*(4).

In each of the branches 324*b*(1) to 324*b*(4), compressed codes associated with numeric character strings each stored in 324*c*(1) to 324*c*(4) are included. When reading a compressed code from, for example, a compressed file, the information processing apparatus 300 compares the read compressed code with the compressed codes included in the branches 324*b*(1) to 324*b*(4), whereby the information processing apparatus 300 specifies the leaf 324*c* that is associated with the read compressed code.

The structure of the leaves associated with the leaves 324*c*(1) to 324*c*(4) is indicated by, for example, a leaf structure 324C. The leaf structure 324C includes leaf identification information, a compressed code length, a pointer to a character code or a numerical value table, and the like. The "leaf identification information" is information for uniquely identifying a leaf. The "compressed code length" is information indicating the valid length of a bit string of compressed data that is acquired by the file read unit 334, which will be described later. For example, because a code with a 16-bit fixed length is allocated to each numeric character string, "16" bits are stored in the compressed code length that is associated with the numeric character string. The "character code" indicates a character code, such as an ASCII code or the like. In a numerical value table that stores therein word codes of a plurality of numeric character strings, the "pointer to a numerical value table" is a pointer that indicates the position in which a word code of a numeric character string associated with the acquired compressed code is stored. In the leaf structure 324C, a pointer to one of the character code and the numerical value table is included.

A numerical value table 324*d* will be described. The numerical value table 324*d* includes all of the word codes allocated to the numeric character strings in the bit filter 121. For example, the numerical value table 324*d* includes the word code 324*d*(1) "B006E0h" of "110", a word code 324*d*(2) "B00730h" of "115", and a word code 324*d*(3) "B007D0h" of "125". The leaves 324*c*(1) to 324*c*(4) are associated with the word codes of the numeric character strings included in the numerical value table 324*d* by the pointers to the numerical value table. For example, in the pointer in the numerical value table related to the leaf structure 324C associated with the numeric character string "110", the offset associated with the top address in the area 324*d*(1) is stored. Furthermore, in the pointer in the numerical value table related to the leaf structure 324C associated with the numeric character string "115", the offset associated with the top address in the area 324*d*(2) is stored.

The file read unit 334 is a processing unit that reads compressed files. The file read unit 334 acquires a compressed code from the compressed files. The file read unit 334 checks the compressed code acquired from the compressed file against the decompression dictionary 324. Namely, the file read unit 334 compares the compressed code acquired from the compressed file with the leaves 324*c*(1) to 324*c*(4) and specifies the leaf structure 324C associated with the compressed code acquired from the compressed file. The file read unit 334 accesses the leaf structure 324C associated with the compressed code. If a pointer of the numerical value table is included in the leaf structure 324C of the accessed leaf, the file read unit 334 acquires a word code from the numerical value table 324d based on the pointer to the numerical value table.

For example, if the acquired compressed code "1010000000010111" hits in the branch 324b(1), the file read unit 334 accesses the leaf 324c(1). If the pointer to the numerical value table is stored in the leaf structure 324C of the leaf 324c(1), the file read unit 334 acquires the pointer to the numerical value table. The file read unit 334 specifies the physical address of the area 324d(2) in the numerical value table 324d based on the pointer to the numerical value table. The file read unit 334 acquires the word code "B00730h" associated with the numeric character string "115" from the area 324d(2). Then, the file read unit 334 outputs the word code "B00730h" associated with the acquired numeric character string "115" to the comparing unit 335.

The comparing unit 335 is a processing unit that compares the word code associated with the search range with each of the word codes acquired by the file read unit 334. The comparing unit 335 acquires a word code associated with both the maximum value and the minimum value of the search range. The comparing unit 335 may also acquire, from the decompression dictionary 324, a word code associated with both the maximum value and the minimum value of the search range. Then, the file read unit 334 reads the compressed files, appropriately acquires a word code of a numeric character string from a compressed file, and outputs the acquired word code of the numeric character string to the comparing unit 335. The comparing unit 335 compares the word code associated with both the maximum value and the minimum value of the search range with the word code acquired by the file read unit 334. The comparing unit 335 determines whether the word code acquired by the file read unit 334 is present within the search range. If the comparing unit 335 determines that the numeric character string targeted for the comparison is present within the search range, the comparing unit 335 outputs the word code associated with the numeric character string targeted for the comparison to the file write unit 336.

Here, a word code allocated to a numeric character string will be described. As described by using the example illustrated in FIG. 8, the 3-byte word code is allocated to the integers from 0 to 16,383 and the 4-byte word code is allocated to the integers from 16,384 to 1,048,575. Furthermore, the 5-byte word code is allocated to the integers from 1,048,576 to 1,073,741,823. The symbols c1-3, c2-3, and c3-3 indicated by the example illustrated in FIG. 8 are information bits indicating the distinction between a half width and a full width, indicating the presence or absence of a comma, indicating the presence or absence of a decimal point, indicating the distinction between a positive value and a negative value, or the like. Namely, the last four bits of the word code correspond to the information bit.

For example, for the integers "0", "1", "2", "3", "4", and "5" . . . , 3-byte word codes "B00000h", "B00010h", "B00020h", "B00030h", and "B00040h" . . . are allocated, respectively. Namely, if word codes are sequentially allocated to integers starting from the smallest integer, word codes are sequentially allocated to the integers in ascending numerical order starting from "B00000h". Consequently, the small-and-large comparison can be performed on the numeric character strings in the state of the word codes. For example, by comparing the word code "B00010h" allocated to the integer "1" with the word code "B00030h" allocated to the integer "3", the comparing unit 335 can determine that the integer "3" is greater.

Comparison between different numeric character strings in the display format, such as the distinction between a half width and a full width, the presence or absence of a comma, or the like, will be described. For example, the word code "B04B00h" is allocated to the numeric character string "1200" and the word code "B04B01h" is allocated to the numeric character string "1,200", i.e., different word codes are allocated; however, the sizes of these numeric character strings are the same. In order to compare word codes related to the numeric character strings each having different display format, the comparing unit 335 performs a mask process.

A specific example of the mask process will be described. When the comparing unit 335 compares the word code "B04B00h" of the numeric character string "1200" with the word code "B04B01h" of the numeric character string "1,200", the comparing unit 335 multiplies a mask process bit string by each of the word codes. Namely, the comparing unit 335 multiplies the mask process bit string "1111 1111 1111 1111 1111 0000" by the word code (binary number) "1011 0000 0100 1011 0000 0000" of the numeric character string "1200" and acquires the bit string "1011 0000 0100 1011 0000 0000". Furthermore, the comparing unit 335 multiplies the mask process bit string "1111 1111 1111 1111 1111 0000" by the word code (binary number) "1011 0000 0100 1011 0000 0001" of the numeric character string "1,200" and acquires the bit string "1011 0000 0100 1011 0000 0000". Then, the comparing unit 335 compares the acquired bit strings and determines that the word code "B04B00h" of the numeric character string "1200" is equal to the word code "B04B01h" of the numeric character string "1,200".

In this way, by multiplying the mask process bit string in which the last four bits are "0" by each of the numeric character strings targeted for the comparison, the comparing unit 335 can compare the word codes related to the numeric character strings in different display formats.

Figure 20:
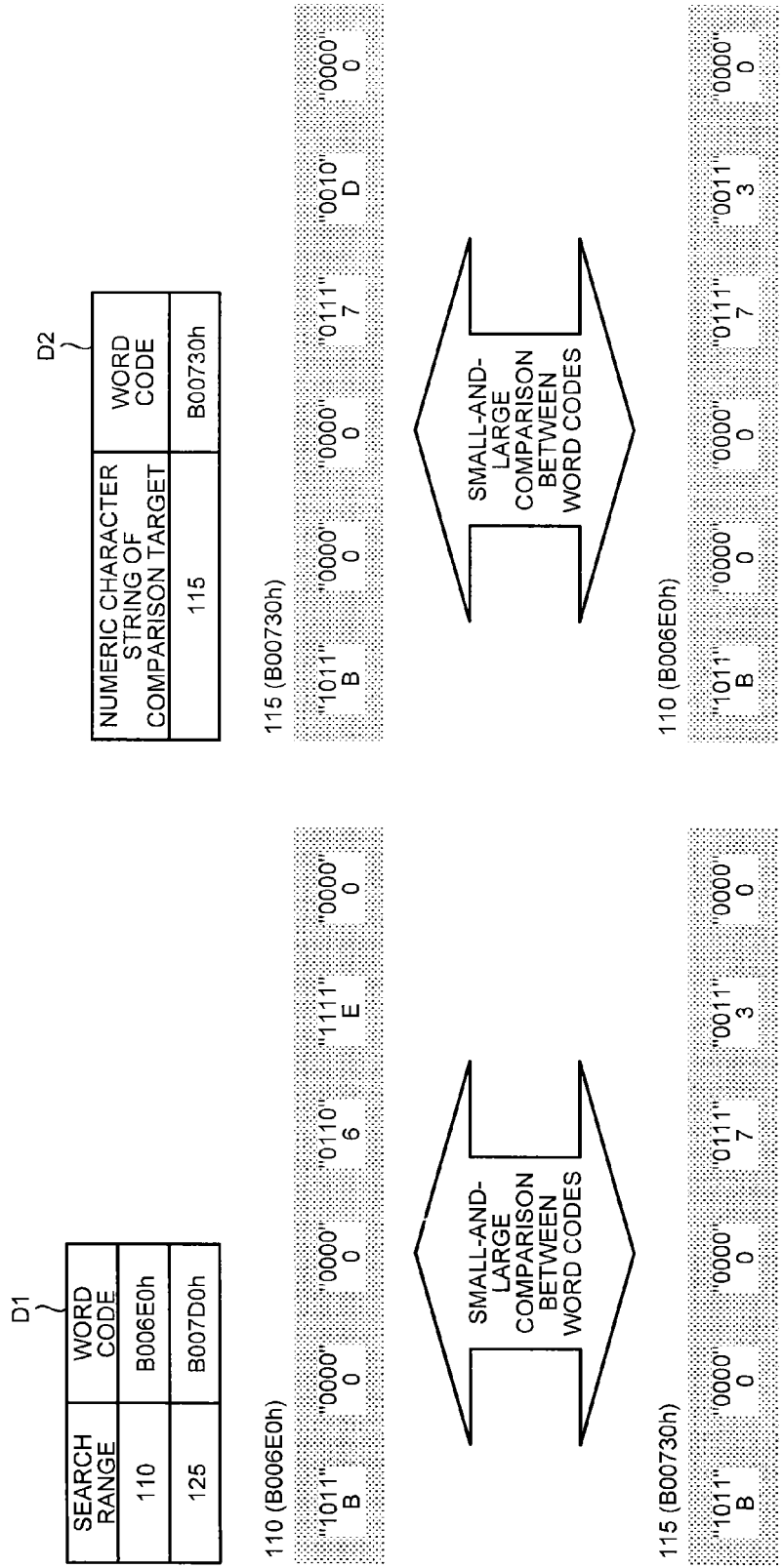
FIG. 20 is a schematic diagram illustrating small-and-large comparison between numeric character strings.

A specific example of the small-and-large comparing process performed by the comparing unit 335 will be described with reference to FIG. 20. FIG. 20 is a schematic diagram illustrating small-and-large comparison between numeric character strings. Table D1 indicates the word codes associated with the maximum value and the minimum value in the search range. In contrast, Table D2 indicates the word code associated with the numeric character string targeted for the comparison. The numeric character string targeted for the comparison mentioned here indicates each of the word codes related to the compressed code acquired from the compressed file by the file read unit 334.

The comparing unit 335 compares the word code "B006E0h" associated with the minimum value "110" in the search range with the word code "B00730h" associated with the numeric character string "115" targeted for the comparison. The comparing unit 335 replaces the word code noted by hexadecimal numbers with binary numbers. Namely, the comparing unit 335 replaces the word code "B006E0h" associated with the minimum value "110" in the search range with "1011", "0000", "0000", "0110", "1111", and "0000". Furthermore, the comparing unit 335 replaces the word code "B00730h" associated with the numeric character string "115" targeted for the comparison with "1011", "0000", "0000", "0111", "0011", and "0000". Then, the comparing unit 335 compares the word code, which has been replaced with the binary numbers, every four bits and determines that the numeric character string "115" targeted for the comparison is greater than the minimum value in the search range.

The comparing unit 335 compares the word code "B007D0h" associated with the maximum value "125" in the search range with the word code "B00730h" associated with the numeric character string "115" targeted for the comparison. The comparing unit 335 replaces the word code "B007D0h" associated with the maximum value "125" in the search range with "1011", "0000", "0000", "1000", "0010", and "0000". Then, the comparing unit 335 compares the word code, which has been replaced with the binary numbers, every four bits and determines that the numeric character string "115" targeted for the comparison is smaller than the maximum value in the search range.

Because the numeric character string targeted for the comparison is greater than the minimum value in the search range and is smaller than the maximum value in the search range, the comparing unit 335 determines that the numeric character string targeted for the comparison is included in the search range. Then, the comparing unit 335 outputs the word code "B00730h" associated with the numeric character string "115" targeted for the comparison to the file write unit 336.

The file write unit 336 is a processing unit that converts the word code in the numeric character string to a numeric character string in the search range and that outputs the numeric character string as the search result. The file write unit 336 converts the word code "B00730h" output from the comparing unit 335 to the numeric character string "115" and displays the converted numeric character string "115" on an output medium, such as a monitor, a printer, or the like, in a predetermined format. For example, in addition to the numeric character string "115", the file write unit 336 displays, on the output medium, the file name in which the numeric character string "115" is included and the number of pages and lines in which the numeric character string "115" is included.

Figure 21:
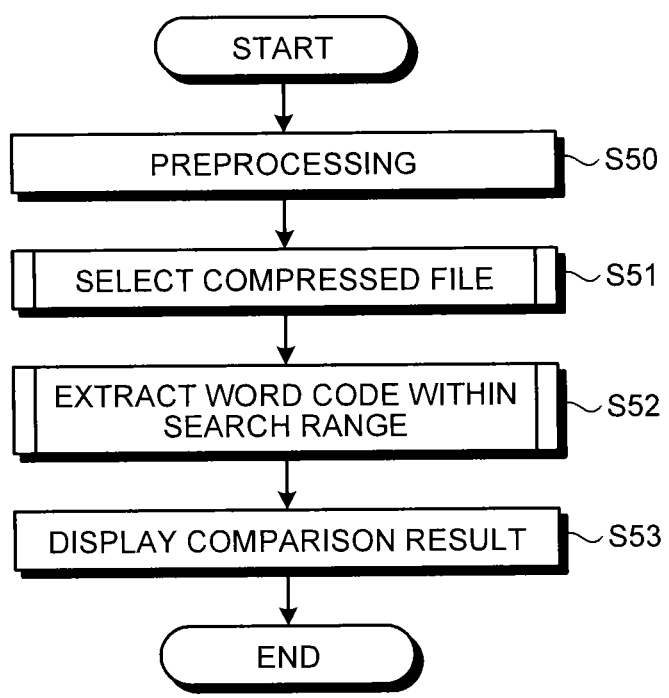
FIG. 21 is a flowchart illustrating the overall flow of the small-and-large comparing process according to the third embodiment.

Overall Flow of the Small-and-Large Comparing Process Performed in the Third Embodiment In the following, the overall flow of the small-and-large comparing process performed in the third embodiment will be described. FIG. 21 is a flowchart illustrating the overall flow of the small-and-large comparing process according to the third embodiment. As in the example illustrated in FIG. 21, the information processing apparatus 300 performs preprocessing (Step S50). For example, the information processing apparatus 300 reserves, as the preprocessing, a work area for performing the small-and-large comparing process. The file selecting unit 332 selects a compressed file to be opened based on the information in the bitmap type full-text index 323 (Step S51). The comparing unit 335 extracts a word code included in the search range from the compressed file selected by the file selecting unit 332 (Step S52). The file write unit 336 converts each of the word codes included in the search range to a numeric character string and outputs each of the converted numeric character strings to the display medium in a predetermined format, whereby the file write unit 336 displays the comparison result (Step S53). The display medium is, for example, a monitor, a printer, or the like.

Flow of the Compressed File Selecting Process Performed in the Third Embodiment

Figure 22:
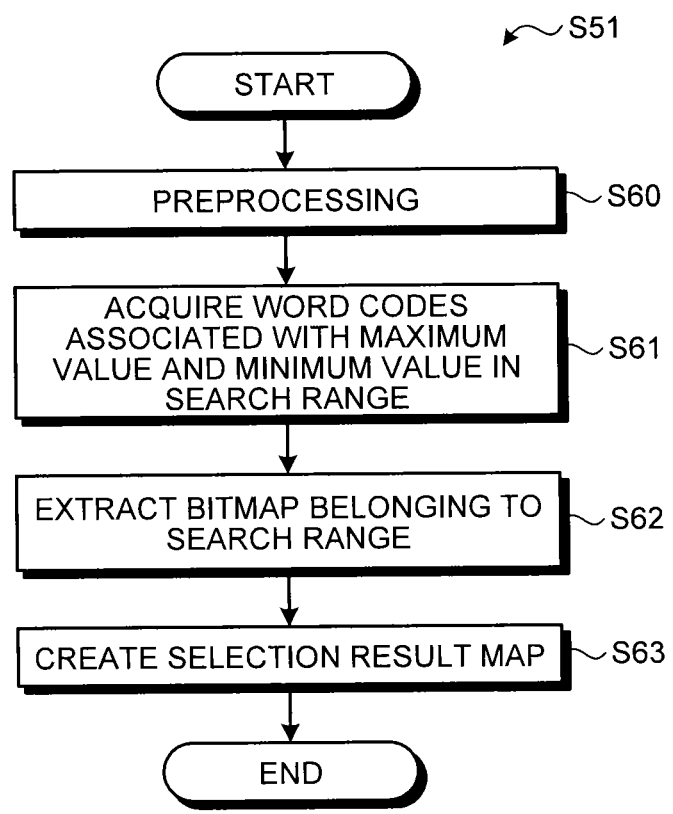
FIG. 22 is a flowchart illustrating the flow of a compressed file selecting process according to the third embodiment.

In the following, the flow of the compressed file selecting process performed in the third embodiment will be described. FIG. 22 is a flowchart illustrating the flow of a compressed file selecting process according to the third embodiment. The process illustrated in FIG. 22 corresponds to the process at Step S51. As in the example illustrated in FIG. 22, the information processing apparatus 100 performs preprocessing (Step S60). For example, the information processing apparatus 100 reserves, as the preprocessing, a work area used for creating a selection result map.

The file selecting unit 332 acquires the word codes associated with the maximum value and the minimum value in the search range received by the search range receiving unit 331 (Step S61). The file selecting unit 332 extracts, based on the acquired word codes associated with the maximum value and the minimum value in the search range, bitmaps belonging to the search range from the bitmap type full-text index 323 (Step S62). The file selecting unit 332 creates a selection result map by performing the OR operation between the plurality of the bitmaps extracted from the bitmap type full-text index 323 (Step S63). The file selecting unit 332 selects a compressed file to be opened based on the created selection result map.

Figure 23:
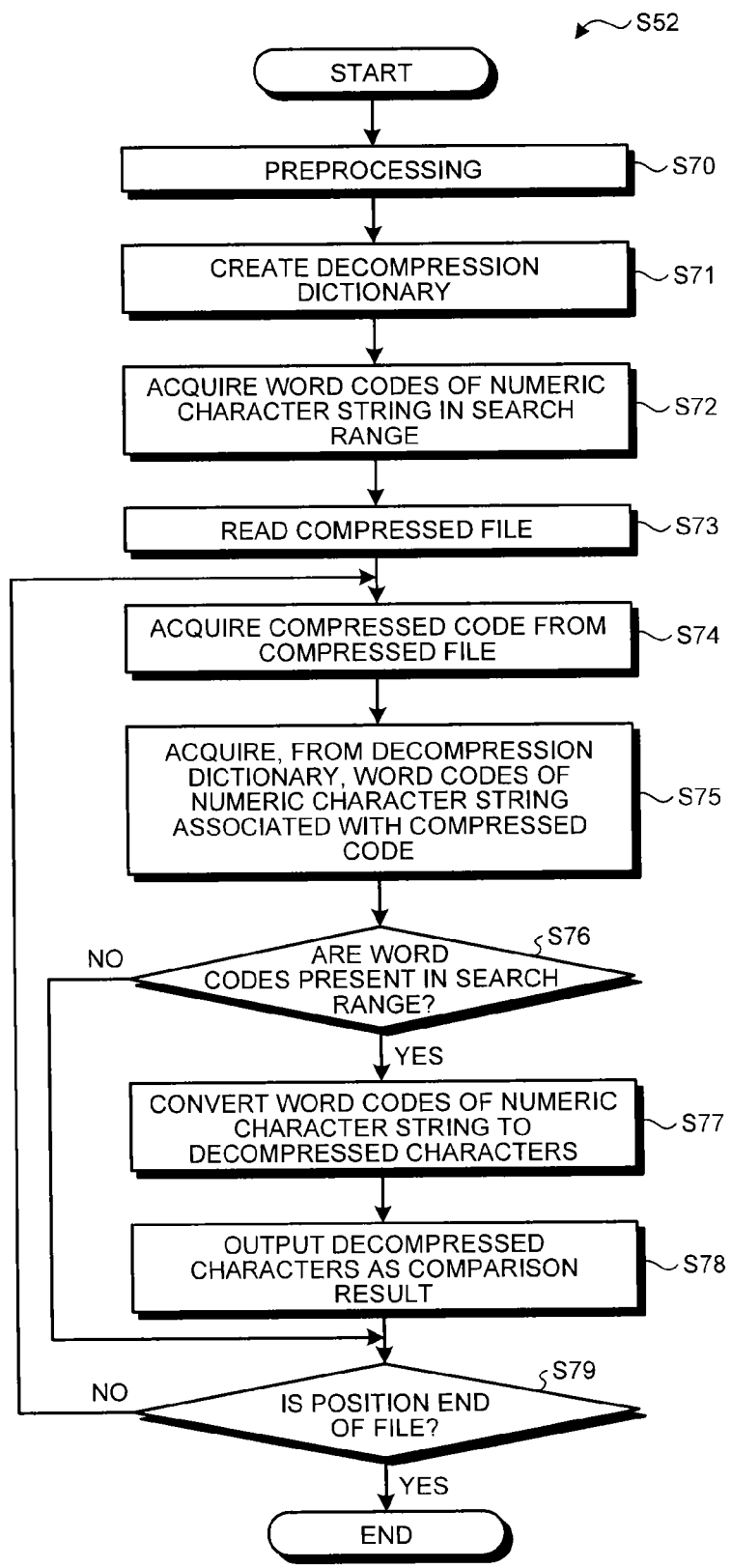
FIG. 23 is a flowchart illustrating the flow of a word code extracting process of a numeric character string according to the third embodiment.

Flow of the Word Code Extracting Process Performed on the Numeric Character String in the Third Embodiment In the following, the flow of the word code extracting process performed on the numeric character string in the third embodiment will be described. FIG. 23 is a flowchart illustrating the flow of a word code extracting process of a numeric character string according to the third embodiment. The process illustrated in FIG. 23 corresponds to the process at Step S52. As in the example illustrated in FIG. 23, the information processing apparatus 300 performs preprocessing (Step S70). For example, the information processing apparatus 300 reserves, as the preprocessing, the area that is used to store therein the decompression dictionary 324 and the work area that is used to perform the small-and-large comparing process.

The decompression dictionary creating unit 333 creates a decompression dictionary (Step S71). The comparing unit 335 acquires the word codes of the numeric character strings associated with the maximum value and the minimum value in the search range (Step S72). For example, the comparing unit 335 acquires, from the decompression dictionary 324, the word codes of the numeric character strings associated with the maximum value and the minimum value in the search range. The file read unit 334 reads the compressed file selected based on the selection result map (Step S73). The file read unit 334 sequentially acquires, from the selected compressed file, 16-bit compressed codes related to the numeric character strings (Step S74). The comparing unit 335 acquires, from the decompression dictionary 324, the word codes of the numeric character strings associated with the compressed code acquired from the compressed file (Step S75).

The comparing unit 335 determines whether the word codes of the numeric character strings are present in the search range (Step S76). If the word codes of the numeric character strings are present in the search range (Yes at Step S76), the comparing unit 335 converts the word code of the numeric character strings to decompressed characters (numeric character strings) (Step S77) and outputs, as the comparison result, the decompressed characters to the output medium, such as a monitor or the like (Step S78). In contrast, if the word codes of the numeric character strings are not present in the search range (No at Step S76), the comparing unit 335 proceeds to the process at Step S79.

The file read unit 334 determines whether the process proceeds to the end of the file (Step S79). If the process proceeds to the end of the file (Yes at Step S79), the file read unit 334 ends the process. In contrast, if the process is at the midpoint of the file (No at Step S79), the file read unit 334 returns to the process at Step S74.

Advantage of the Third Embodiment

The processing unit 330 converts the compressed code extracted from a compressed file to a code by using a dictionary in which, in addition to a numeric character string that indicates a numerical value and that includes therein at least one numeral, codes that are sequentially allocated in accordance with the order of the magnitude of numerical values and compressed codes are stored in an associated manner. The processing unit 330 determines whether the converted code is included in the search range by comparing the converted code with one or more codes associated with the search range of the numeric character strings. If the processing unit 330 determines that the converted code is included in the search range, the processing unit 330 decompresses the converted code to a numeric character string and displays the decompression result. Consequently, because the processing unit 330 only needs to decompress the word codes included in the search range to numeric character strings instead of decompressing all of the word codes to numeric character strings, it is possible to speed up a search of a numeric character string.

The processing unit 330 specifies a compressed file that includes therein a numeric character string in the search range by using the index that includes information related to the compressed file that includes therein each of the numeric character strings. Consequently, because the compressed file that includes a numeric character string within the search range is specified and the compressed files to be opened are narrowed down, it is possible to speed up the numeric character string search even if the plurality of compressed files are present.

Another Embodiment of the First to the Third Embodiments

In the following, some modification of the embodiment described above will be described. In addition to the modification described below, design changes can be appropriately made without departing from the scope of the present invention.

Furthermore, in addition to data in a file, monitoring messages that are output from the system may also be the target for the compression process. For example, the monitoring messages that are sequentially stored in a buffer are compressed by using the compression process described above and the compressed messages are stored as log files. Furthermore, for example, the compression may also be performed in units of pages in a database or the compression may also be performed in units of sets of a plurality of pages.

Furthermore, the flow of the processes, the control procedures, the specific names, and the information containing various kinds of data or parameters indicated in the first embodiment can be arbitrarily changed unless otherwise stated.

Hardware Configuration of the Information Processing Apparatus

Figure 24:
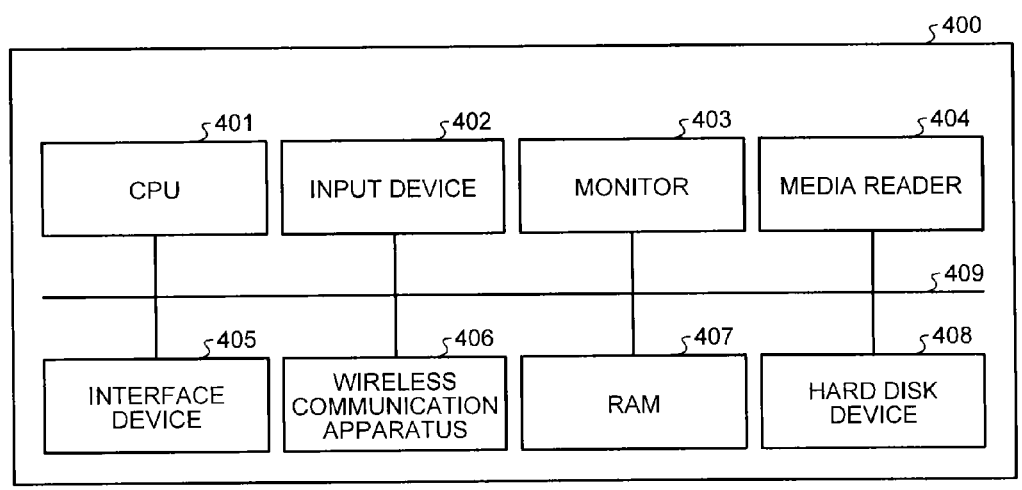
FIG. 24 is a schematic diagram illustrating the hardware configuration of the information processing apparatus according to the first to the third embodiments.

FIG. 24 is a schematic diagram illustrating the hardware configuration of the information processing apparatus according to the first to the third embodiments. As indicated by the example illustrated in FIG. 24, a computer 400 includes a CPU 401 that executes various kinds of arithmetic processing, an input device 402 that receives data input by a user, and a monitor 403. Furthermore, the computer 400 includes a media reader 404 that reads a program or the like from a storage medium, an interface device 405 for connecting another device, and a wireless communication apparatus 406 that is used to wirelessly connect to the other device. Furthermore, the computer 400 includes a RAM 407 that temporarily stores therein various kinds of information and a hard disk device 408. Furthermore, each of the devices 401 to 408 is connected to a bus 409.

The hard disk device 408 stores therein an information processing program having the same function as that performed by each of the processing units, such as the file read unit 111, the compressed code adding unit 112, and the file write unit 113 illustrated in FIG. 6. Furthermore, the hard disk device 408 stores therein the information processing program having the same function as that performed by each of the processing units, such as the file read unit 111, the compressed code adding unit 112, and the file write unit 113. Furthermore, the hard disk device 408 stores therein various kinds of data that implements the information processing program.

The CPU 401 reads each of the programs stored in the hard disk device 408 and loads the programs in the RAM 407, thereby performing various processes. These programs allows the computer 400 to function as, for example, the file read unit 111, the compressed code adding unit 112, and the file write unit 113 illustrated in FIG. 6. Furthermore, these programs allows the computer 400 to function as the file read unit 111, the compressed code adding unit 112, and the file write unit 113.

The information processing programs described above are not always stored in the hard disk device 408. For example, the computer 400 may also read and execute programs stored in a computer readable recording medium. Examples of the recording medium that can be read by the computer 400 include a portable recording medium, such as a CD-ROM, a DVD disk, or a universal serial bus (USB) memory, a semiconductor memory, such as a flash memory, and a hard disk drive. Furthermore, the information processing programs may also be stored in a device connected to, for example, a public circuit, the Internet, a local area network (LAN), or the like and the computer 400 may also read and execute the information processing programs from the recording medium described above.

Figure 25:
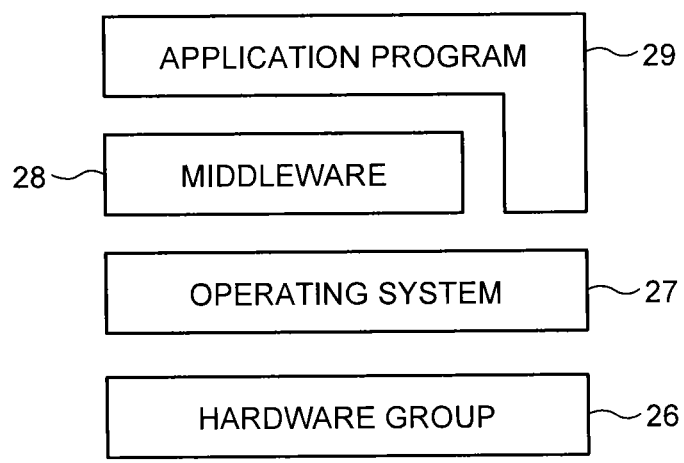
FIG. 25 is a schematic diagram illustrating the configuration example of a program operating in a computer.

FIG. 25 is a schematic diagram illustrating the configuration example of a program operating in a computer. In the computer 400, an operating system (OS) 27 that controls a hardware group 26 (401 to 409) illustrated in FIG. 24 is operated. The CPU 401 operates in accordance with the procedure of the OS 27 and then control and management of the hardware group 26 is performed, whereby the processes in accordance with an application program 29 or middleware 28 are performed in the hardware group 26. Furthermore, in the computer 400, the middleware 28 or the application program 29 are read into the RAM 407 and is executed by the CPU 401.

If a compression function is called by the CPU 401, by performing processes based on at least a part of the middleware 28 or the application program 29 (by controlling the hardware group 26 based on the OS 27), the function performed by the compressing unit 110 can be implemented. The compression function may also be included in the application program 29 itself or may be a part of the middleware 28 that is executed by being called in accordance with the application program 29.

The compressed file that can be obtained by the compression function performed by the application program 29 (or the middleware 28) may also be partially decompressed. If the midpoint of the compressed file is decompressed, because the decompression process of the compressed data up to the decompression target point is suppressed, the load applied to the CPU 401 is suppressed. Furthermore, because the compressed data targeted for the decompression is partly loaded in the RAM 407, a work area is also reduced.

Figure 26:
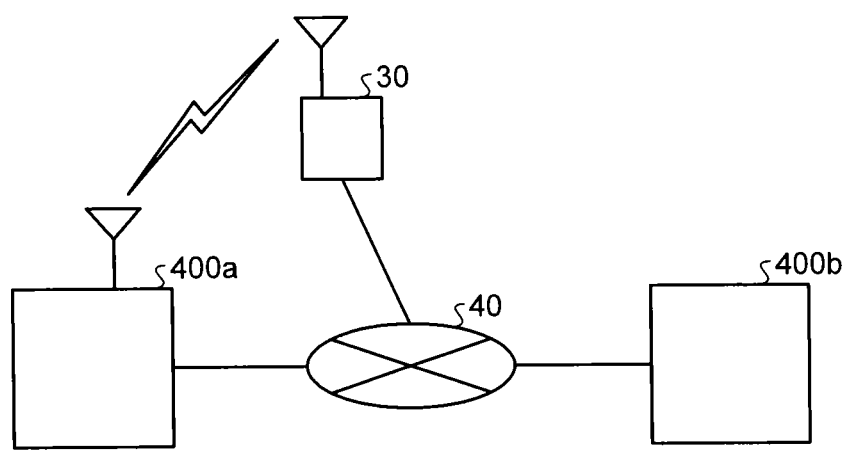
FIG. 26 is a schematic diagram illustrating the configuration example of a device in a system according to an embodiment.

FIG. 26 is a schematic diagram illustrating the configuration example of a device in a system according to an embodiment. The system illustrated in FIG. 26 includes a computer 400a, a computer 400b, a base station 30, and a network 40. The computer 400a is connected to the network 40 that is connected to the computer 400b by using wireless or wired connection.

According to an aspect of an embodiment of the present invention, an advantage is provided in that it is possible to reduce the code length that is allocated to a numerical value when a compression process is performed.

All examples and conditional language recited herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a compression program that causes a computer to execute a process comprising:
   extracting a numeric character string from input data, the numeric character string indicating a numerical value and including therein at least one numeral; and
   converting the numeric character string to a compressed code utilizing a dictionary that associates numeric character strings and compressed codes.

2. The non-transitory computer-readable recording medium according to claim 1, wherein
   the dictionary includes a first dictionary in which a plurality of predetermined numeric character strings are previously stored and a second dictionary in which the numeric character strings registered in the first dictionary are stored, and
   the process further includes, when the extracted numeric character string is registered in the first dictionary and the compressed code associated with the numeric character string is not registered in the first dictionary, adding a compressed code to the numeric character string, associating with the numeric character string registered in the first dictionary, and registering the compressed code.

3. The non-transitory computer-readable recording medium according to claim 2, wherein the first dictionary is a dictionary in which, in addition to numeric character strings that are extracted, codes that are sequentially allocated in accordance with an order of a magnitude of numerical values are further associated and stored.

4. The non-transitory computer-readable recording medium according to claim 1, wherein the process further includes updating, when the numeric character string is extracted at the extracting, an index that stores therein, in an associated manner for each numeric character string, an information bit string that indicates a compressed file containing therein a numeric character string from among a plurality of compressed files.

5. A compression device comprising:
   circuitry configured to:
      extract a numeric character string from input data, the numeric character string indicating a numerical value and including therein at least one numeral; and
      convert the numeric character string to a compressed code utilizing a dictionary that associates numeric character strings and compressed codes.

6. A compression method comprising:
   extracting a numeric character string from input data, the numeric character string indicating a numerical value and including therein at least one numeral; and
   converting the numeric character string to a compressed code utilizing a dictionary that associates numeric character strings and compressed codes.

7. A non-transitory computer-readable recording medium having stored therein a decompression program that causes a computer to execute a process comprising:
   converting, by using a dictionary in which, in addition to a numeric character string that indicates a numerical value and that includes therein at least one numeral, codes that are sequentially allocated in accordance with an order of a magnitude of numerical values and compressed codes are stored in an associated manner, a compressed code extracted from a compressed file to a code;
   determining whether the converted code is included in a search range by comparing the converted code with one or more codes associated with the search range of numeric character strings; and
   decompressing, when it is determined that the converted code is included in the search range, the converted code to a numeric character string and displaying the decompression result.

8. The non-transitory computer-readable recording medium according to claim 7, wherein the process further includes specifying, by using an index that includes therein information related to a compressed file that includes therein numeric character strings, a compressed file that includes therein a numeric character string in the search range.

9. A decompression device comprising:
   circuitry configured to:
      convert, by using a dictionary in which codes that are sequentially allocated in accordance with an order of a magnitude of numeric character strings each of which indicates a numerical value and includes therein at least one numeral and compressed codes are stored in an associated manner, a compressed code extracted from a compressed file to a code;
      determine whether the converted code is included in a search range by comparing the converted code with one or more codes that are associated with the search range of numeric character strings; and
      decompress, when it is determined that the converted code is included in the search range at the determining, the converted code to a numeric character string and display the decompression result.

10. A decompression method comprising:
    converting, by using a dictionary in which codes that are sequentially allocated in accordance with an order of a magnitude of numeric character strings each of which indicates a numerical value and includes therein at least one numeral and compressed codes are stored in an associated manner, a compressed code extracted from a compressed file to a code, by a processor;
    determining whether the converted code is included in a search range by comparing the converted code with one or more codes that are associated with the search range of numeric character strings, by the processor; and decompressing, when it is determined that the converted code is included in the search range, the converted code to a numeric character string and displaying the decompression result, by the processor.

* * * * *